(12) United States Patent
Hong et al.

(10) Patent No.: US 10,553,693 B2
(45) Date of Patent: Feb. 4, 2020

(54) SEMICONDUCTOR DEVICE

(71) Applicant: SAMSUNG ELECTRONICS CO., LTD., Suwon-si, Gyeonggi-do (KR)

(72) Inventors: Se Ki Hong, Hwaseong-si (KR); Ju Youn Kim, Suwon-si (KR); Jin-Wook Kim, Hwaseong-si (KR); Tae Eung Yoon, Seoul (KR); Tae Won Ha, Seongnam-si (KR); Jung Hoon Seo, Suwon-si (KR); Seul Gi Yun, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/958,061

(22) Filed: Apr. 20, 2018

(65) Prior Publication Data
US 2019/0131417 A1 May 2, 2019

(30) Foreign Application Priority Data
Oct. 27, 2017 (KR) .................. 10-2017-0141002

(51) Int. Cl.
*H01L 29/00* (2006.01)
*H01L 29/423* (2006.01)
*H01L 27/092* (2006.01)
*H01L 29/06* (2006.01)
*H01L 29/49* (2006.01)
*H01L 21/28* (2006.01)
(Continued)

(52) U.S. Cl.
CPC .. *H01L 29/42376* (2013.01); *H01L 21/28088* (2013.01); *H01L 21/28114* (2013.01); *H01L 21/823821* (2013.01); *H01L 21/823828* (2013.01); *H01L 27/0924* (2013.01); *H01L 29/0649* (2013.01); *H01L 29/42372* (2013.01); *H01L 29/4966* (2013.01); *H01L 29/66545* (2013.01)

(58) Field of Classification Search
None
See application file for complete search history.

(56) References Cited

U.S. PATENT DOCUMENTS

| | | | |
|---|---|---|---|
| 5,450,225 A | 9/1995 | Bostica et al. | |
| 6,586,305 B2 * | 7/2003 | Graf | .......... H01L 21/76897 257/E21.507 |
| 7,053,009 B2 | 5/2006 | Conley, Jr. et al. | |

(Continued)

OTHER PUBLICATIONS

"MSE 5317" by Dharma (Year: 2019).*

*Primary Examiner* — Evren Seven
(74) *Attorney, Agent, or Firm* — Lee & Morse, P.C.

(57) ABSTRACT

A semiconductor device includes a substrate having first and second active regions with a field insulating layer therebetween that contacts the first and second active regions, and a gate electrode on the substrate and traversing the first active region, the second active region, and the field insulating layer. The gate electrode includes a first portion over the first active region, a second portion over the second active region, and a third portion in contact with the first and second portions. The gate electrode includes an upper gate electrode having first through third thicknesses in the first through third portions, respectively, where the third thickness is greater than the first thickness, and smaller than the second thickness.

17 Claims, 23 Drawing Sheets

(51) Int. Cl.
*H01L 21/8238* (2006.01)
*H01L 29/66* (2006.01)

(56) References Cited

U.S. PATENT DOCUMENTS

| | | | |
|---|---|---|---|
| 7,282,762 B2 | 10/2007 | Forbes | |
| 7,339,239 B2 | 3/2008 | Forbes | |
| 8,298,927 B2 | 10/2012 | Xu et al. | |
| 8,367,558 B2 | 2/2013 | Xu et al. | |
| 8,841,731 B2* | 9/2014 | Chen | H01L 21/28088 |
| | | | 257/369 |
| 8,865,581 B2 | 10/2014 | Clark | |
| 9,012,319 B1 | 4/2015 | Choi et al. | |
| 9,209,186 B1 | 12/2015 | Togo et al. | |
| 9,337,107 B2 | 5/2016 | Zhao | |
| 9,368,499 B2 | 6/2016 | Hong et al. | |
| 9,461,132 B2 | 10/2016 | Cheon et al. | |
| 9,508,535 B2 | 11/2016 | Wollnik et al. | |
| 9,530,778 B1 | 12/2016 | Lin et al. | |
| 10,068,904 B2* | 9/2018 | Kim | H01L 21/823857 |
| 2008/0116543 A1 | 5/2008 | Govindarajan | |
| 2012/0074475 A1* | 3/2012 | Chew | H01L 21/28079 |
| | | | 257/295 |
| 2013/0049119 A1 | 2/2013 | Huang et al. | |
| 2015/0014780 A1* | 1/2015 | Kim | H01L 27/0924 |
| | | | 257/369 |
| 2016/0351568 A1* | 12/2016 | Chang | H01L 29/785 |
| 2017/0069539 A1* | 3/2017 | Li | H01L 21/823431 |
| 2017/0162686 A1 | 6/2017 | Arimura | |
| 2018/0151573 A1* | 5/2018 | Li | H01L 21/28079 |
| 2018/0190666 A1* | 7/2018 | Li | H01L 21/823842 |
| 2018/0350955 A1* | 12/2018 | Chen | H01L 29/66795 |

\* cited by examiner

SEMICONDUCTOR DEVICE

CROSS-REFERENCE TO RELATED APPLICATION

Korean Patent Application No. 10-2017-0141002 filed on Oct. 27, 2017, in the Korean Intellectual Property Office, and entitled: "Semiconductor Device," is incorporated by reference herein in its entirety.

BACKGROUND

1. Field

The present disclosure relates to a semiconductor device.

2. Description of the Related Art

Recently, with rapid supply of information media, the functions of semiconductor devices have been dramatically developed. In recent semiconductor products, high integration of products is required for low cost and high quality in order to ensure competitiveness. For high integration, the scaling down of semiconductor devices has been in progress.

Research is underway to increase the operation speed and the integration degree of the semiconductor device. Semiconductor devices may include discrete devices, e.g., MOS transistors. As the semiconductor device is integrated, the size of the gate of the MOS transistor is gradually scaled down, and the lower channel region of the gate is also becoming narrower.

The critical dimension of the gate region of the transistor has a great influence on the electrical characteristics of the transistor. That is, when the width of the gate region is reduced as the semiconductor device is highly integrated, a distance between the source and drain regions, between which the gate region is formed, is also reduced.

SUMMARY

According to aspects of embodiments, there is provided a semiconductor device including a substrate including a first active region, a second active region and a field insulating layer between the first active region and the second active region, the field insulating layer being in contact with the first active region and the second active region, and a gate electrode structure on the substrate, the gate electrode structure traversing the first active region, the second active region and the field insulating layer, wherein the gate electrode structure includes a first portion formed over the first active region and the field insulating layer, a second portion formed over the second active region and the field insulating layer, and a third portion in contact with the first portion and the second portion on the field insulating layer, wherein the gate electrode structure includes an upper gate electrode including an insertion layer traversing the first active region, the field insulating layer and the second active region, and a filling layer on the insertion layer, wherein a thickness of the upper gate electrode in the third portion of the gate electrode structure is greater than a thickness of the upper gate electrode in the first portion of the gate electrode structure, and wherein a thickness of the upper gate electrode in the third portion of the gate electrode structure is smaller than a thickness of the upper gate electrode in the second portion of the gate electrode structure.

According to aspects of embodiments, there is provided a semiconductor device including a first fin-shaped pattern and a second fin-shaped pattern adjacent to each other on a substrate, a field insulating layer between the first fin-shaped pattern and the second fin-shaped pattern, the field insulating layer covering a portion of the first fin-shaped pattern and a portion of the second fin-shaped pattern, an interlayer insulating layer on the substrate, the interlayer insulating layer including a trench traversing the first fin-shaped pattern, the field insulating layer and the second fin-shaped pattern, a gate insulating layer extending along a sidewall and a bottom surface of the trench, and a gate electrode structure on the gate insulating layer, the gate electrode structure traversing the first fin-shaped pattern, the field insulating layer and the second fin-shaped pattern, wherein the gate electrode structure includes a first portion formed over the first fin-shaped pattern and the field insulating layer, a second portion formed over the second fin-shaped pattern and the field insulating layer, and a third portion in contact with the first portion and the second portion on the field insulating layer, wherein the gate electrode structure includes a work function adjusting layer formed over the first fin-shaped pattern and the field insulating layer, and an upper gate electrode on the work function adjusting layer, wherein the upper gate electrode includes an insertion layer on the work function adjusting layer and traversing the first fin-shaped pattern, the field insulating layer and the second fin-shaped pattern, and a filling layer on the insertion layer, wherein a thickness of the upper gate electrode in the third portion of the gate electrode structure is greater than a thickness of the upper gate electrode in the first portion of the gate electrode structure, and wherein a thickness of the upper gate electrode in the third portion of the gate electrode structure is smaller than a thickness of the upper gate electrode in the second portion of the gate electrode structure.

According to aspects of embodiments, there is provided a semiconductor device including a substrate including a first active region, a second active region, a first field insulating layer in contact with the first active region and the second active region between the first active region and the second active region, a third active region, a fourth active region and a second field insulating layer in contact with the third active region and the fourth active region between the third active region and the fourth active region, a first gate electrode structure on the substrate, the first gate electrode structure traversing the first active region, the second active region and the first field insulating layer, and a second gate electrode structure on the substrate, the second gate electrode structure traversing the third active region, the fourth active region and the second field insulating layer, wherein the first gate electrode structure includes a first portion formed over the first active region and the field insulating layer, a second portion formed over the second active region and the field insulating layer, and a third portion in contact with the first portion and the second portion on the field insulating layer, wherein the second gate electrode structure includes a fourth portion formed over the third active region and the second field insulating layer, and a fifth portion formed over the fourth active region and the second field insulating layer, wherein the first gate electrode structure includes a first insertion layer traversing the first active region, the first field insulating layer and the second active region, and a first upper gate electrode including a first filling layer on the first insertion layer, wherein the second gate electrode structure includes a second insertion layer traversing the third active region, the second field insulating layer and the fourth active region, and a second upper gate electrode including a second filling layer on the second insertion layer, wherein a thickness of the first upper gate electrode in the third portion of the first gate electrode structure is greater than a thickness of the upper gate electrode in the first portion of the first gate electrode structure, wherein a thickness of the first upper gate electrode in the third portion of the first gate electrode structure is smaller than a thickness of the first upper gate electrode in the second portion of the first gate electrode structure, and wherein a thickness of the second upper gate electrode in the fifth portion of the second gate electrode structure is different from a thickness of the second upper gate electrode in the fourth portion of the second gate electrode structure.

According to aspects of embodiments, there is provided a semiconductor device including a substrate including a first active region, a second active region and a field insulating layer between the first active region and the second active region, the field insulating layer being in contact with the first active region and the second active region, a gate insulating layer on the substrate, the gate insulating layer traversing the first active region, the field insulating layer and the second active region, and a gate electrode structure on the gate insulating layer, the gate electrode structure traversing the first active region, the field insulating layer and the second active region, wherein the gate electrode structure includes a first portion formed over the first active region and the field insulating layer, and a second portion formed over the second active region and the field insulating layer, wherein the gate electrode structure includes a work function adjusting layer extending along a profile of the gate insulating layer and an upper gate electrode on the work function adjusting layer, wherein the work function adjusting layer includes a lower work function adjusting layer and an upper work function adjusting layer on the lower work function adjusting layer, the upper work function adjusting layer being in contact with the lower work function adjusting layer, wherein the lower work function adjusting layer is included in the first portion of the gate electrode structure and is not included in the second portion of the gate electrode structure, wherein the upper work function adjusting layer is included in the first portion of the gate electrode structure and the second portion of the gate electrode structure, and wherein the lower work function adjusting layer and the upper work function adjusting layer include the same material.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
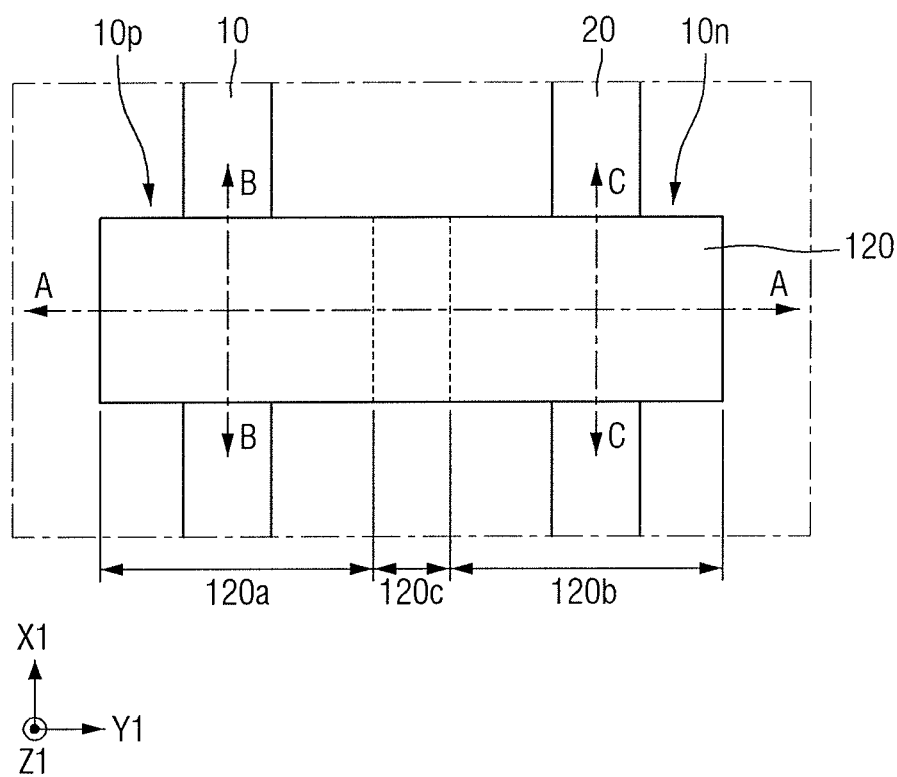
FIG. 1 illustrate a plan view of a semiconductor device according to some embodiments of the present disclosure.

In the drawings relating to a semiconductor device according to some embodiments of the present disclosure, a fin-type transistor (FinFET) including a channel region of a fin-shaped pattern or a planar transistor has been shown as an example, but the present disclosure is not limited thereto. A semiconductor device according to some embodiments of the present disclosure may include a tunneling FET, a transistor including a nanowire, a transistor including a nanosheet, or a three-dimensional (3D) transistor.

Figure 2A:
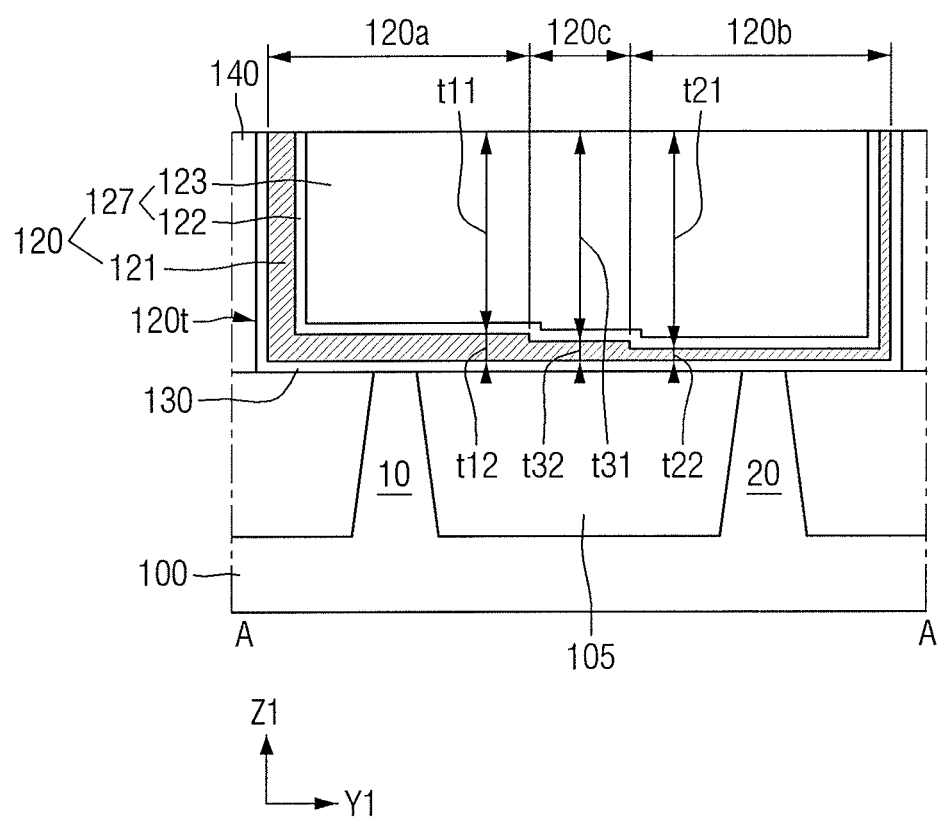
FIGS. 2A and 2B illustrate cross-sectional views along line A-A of FIG. 1.
Figure 2B:
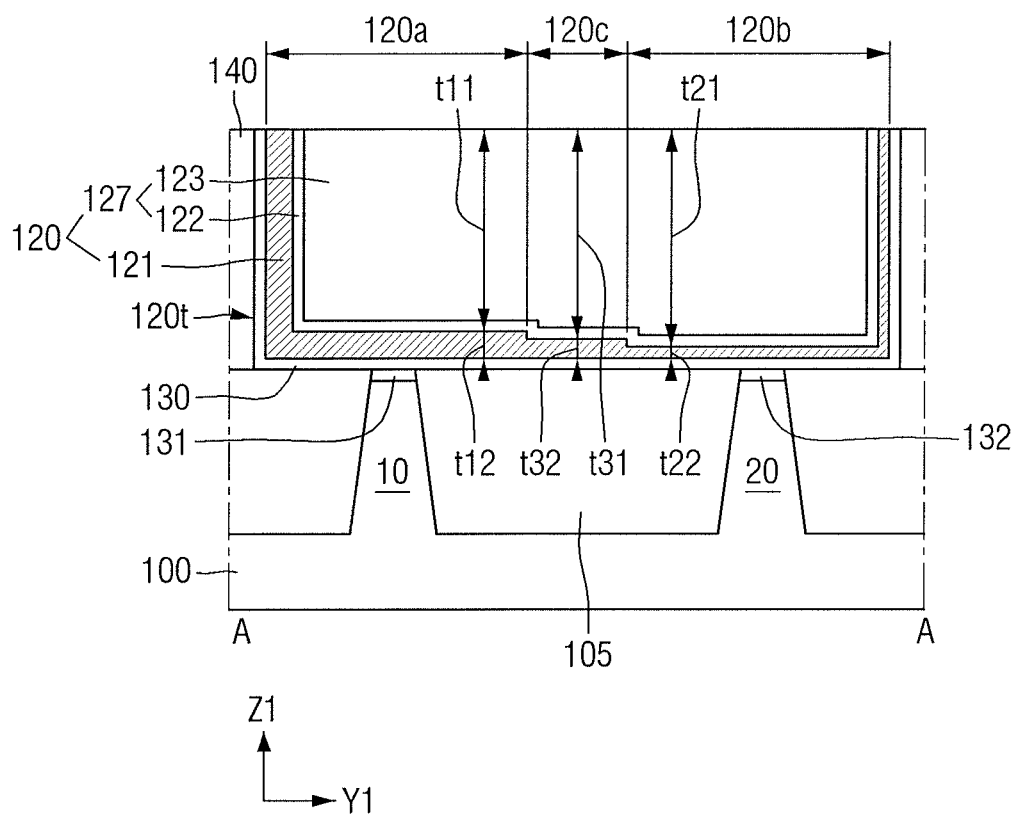
Figure 3A:
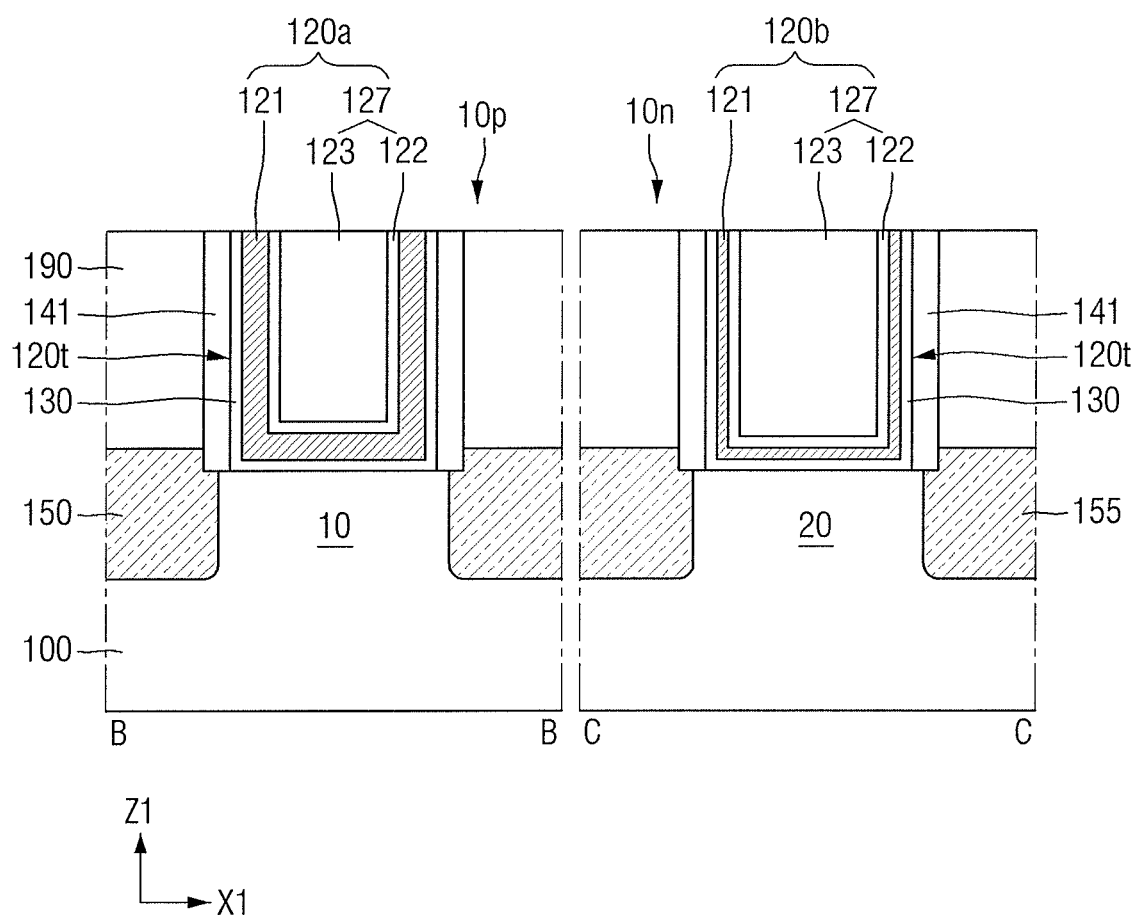
FIGS. 3A and 3B illustrate cross-sectional views along lines B-B and C-C of FIG. 1, respectively.
Figure 3B:
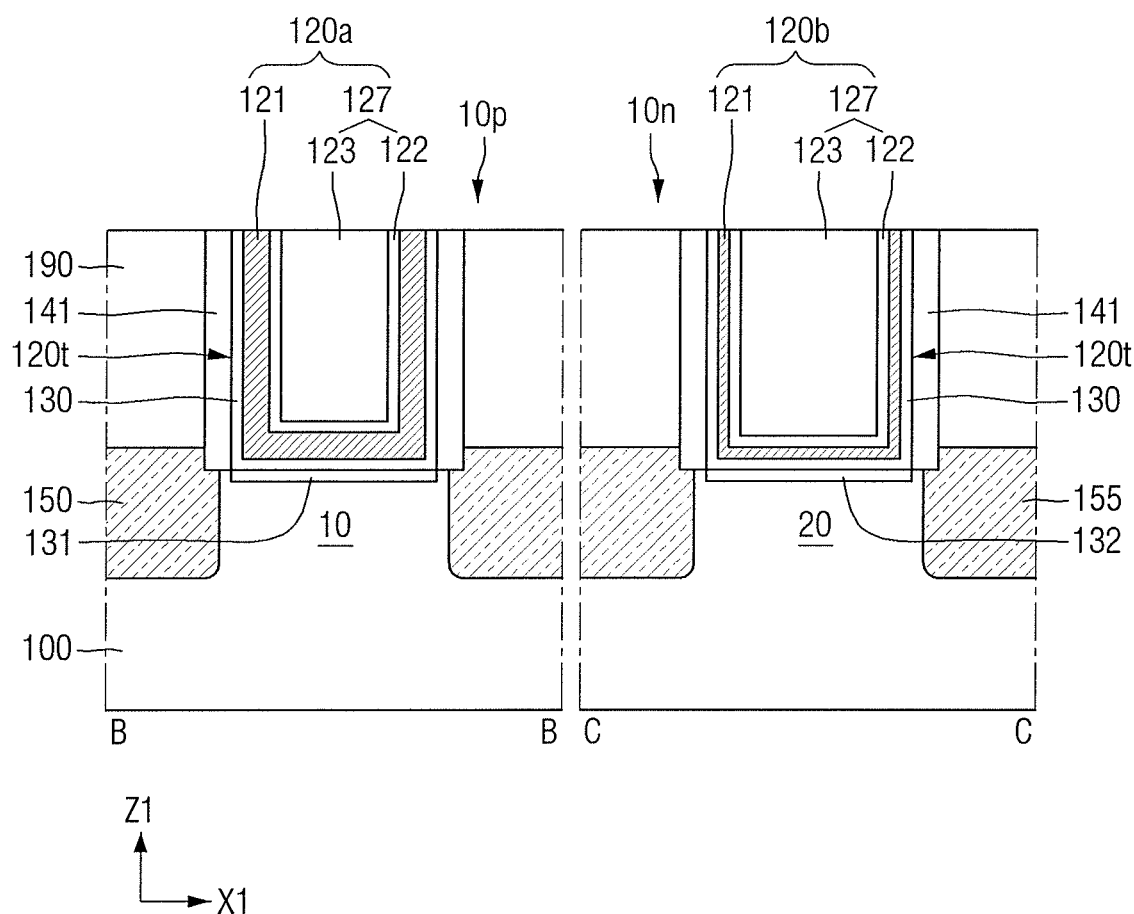

FIG. 1 is a plan view illustrating a semiconductor device according to some embodiments of the present disclosure. FIGS. 2A and 2B are cross-sectional views taken along line A-A of FIG. 1. FIGS. 3A and 3B are cross-sectional views taken along lines B-B and C-C of FIG. 1, respectively. For reference, for simplicity of description, FIG. 1 schematically shows only a portion of a semiconductor device that includes a first active region 10, a second active region 20, and a first gate electrode structure 120.

Referring to FIGS. 1 to 3B, a semiconductor device according to some embodiments of the present disclosure may include a substrate 100 having the first active region 10, the second active region 20, a first field insulating layer 105, and a first gate electrode structure 120 traversing the first active region 10, the second active region 20, and the first field insulating layer 105.

For example, the substrate 100 may be bulk silicon or silicon-on-insulator (SOI). In another example, the substrate 100 may be a silicon substrate or may include other materials, e.g., silicon germanium, silicon germanium on insulator (SGOI), indium antimonide, lead tellurium compound, indium arsenide, indium phosphide, gallium arsenide or gallium antimonide, but the present disclosure is not limited thereto. In the following description, it is assumed that the substrate 100 is a substrate containing silicon.

The first active region 10 and the second active region 20 may be defined by the first field insulating layer 105. The first active region 10 and the second active region 20 are spatially separated, but are adjacent to each other. The first active region 10 and the second active region 20 may have a rectangular shape elongated in a first direction X1, but the present disclosure is not limited thereto. The first active region 10 and the second active region 20 may be arranged side by side so as to be adjacent to each other in a long side direction, e.g., long sides of the first and second active regions 10 and 20 may be adjacent to each other and facing each other with the first field insulating layer 105 therebetween.

The first active region 10 and the second active region 20 may include transistors of the same conductivity type, or transistors of different conductivity types. For example, the active regions adjacent to each other with a gate voltage applied by one gate electrode structure may be the first active region 10 and the second active region 20. In the semiconductor device according to some embodiments of the present disclosure, the first active region 10 may be a region where a PMOS is formed, and the second active region 20 may be a region where an NMOS is formed. The first active region 10 may include a channel region of a p-type transistor and the second active region 20 may include a channel region of an n-type transistor.

The first field insulating layer 105 may be formed to surround, e.g., each of, the first active region 10 and the second active region 20. However, in the semiconductor device according to some embodiments of the present disclosure, the first field insulating layer 105 refers to a portion located between the first active region 10 and the second active region 20.

The first field insulating layer 105 may be disposed between the first active region 10 and the second active region 20, and may be in contact with the first active region 10 and the second active region 20. The first field insulating layer 105 being in contact with the first active region 10 and the second active region 20 means that an active region used as a channel region is not interposed between the first active region 10 and the second active region 20.

The first field insulating layer 105 may include at least one of, e.g., an oxide layer, a nitride layer, an oxynitride layer, and a combination thereof. Further, the first field insulating layer 105 may further include at least one field liner film formed between the first active region 10 and the first field insulating layer 105, and between the second active region 20 and the first field insulating layer 105. When the first field insulating layer 105 further includes a field liner film, the field liner film may include at least one of, e.g., polysilicon, amorphous silicon, silicon oxynitride, silicon nitride and silicon oxide.

The first gate electrode structure 120 may be formed on the substrate 100. The first gate electrode structure 120 may traverse the first active region 10, the second active region 20, and the first field insulating layer 105. The first gate electrode structure 120 may be elongated in a second direction Y1. The first gate electrode structure 120 may include a short sidewall including a short side extending in the first direction X1 and a long sidewall including a long side extending in the second direction Y1.

The first gate electrode structure 120 may include a first portion 120a and a second portion 120b, and a third portion 120c between the first portion 120a and the second portion 120b. The third portion 120c of the first gate electrode structure is in contact with the first portion 120a of the first gate electrode structure and the second portion 120b of the first gate electrode structure.

The first portion 120a of the first gate electrode structure may be a p-type metallic gate electrode. The first portion 120a of the first gate electrode structure may be formed on the first active region 10 and the first field insulating layer 105. The first portion 120a of the first gate electrode structure may be formed over the first active region 10 and the first field insulating layer 105.

The second portion 120b of the first gate electrode structure may be an n-type metallic gate electrode. The second portion 120b of the first gate electrode structure may be formed on the second active region 20 and the first field insulating layer 105. The second portion 120b of the first gate electrode structure may be formed over the second active region 20 and the first field insulating layer 105.

The third portion 120c may be connecting the first and second portions 120a and 120b to each other. For example, the third portion 120c of the first gate electrode structure may be a connection gate electrode connecting the p-type metallic gate electrode and the n-type metallic gate electrode. In another example, the third portion 120c of the first gate electrode structure may be a portion of a p-type metallic gate electrode or n-type metallic gate electrode.

A p-type first transistor 10p may be formed in a region where the first active region 10 and the first gate electrode structure 120 cross each other. An n-type second transistor 10n may be formed in a region where the second active region 20 and the first gate electrode structure 120 cross each other. The first transistor 10p and the second transistor 10n of different conductivity types may share the first gate electrode structure 120.

Since the first portion 120a of the first gate electrode structure extends over the first field insulating layer 105, it overlaps a portion of the first field insulating layer 105 as well as the first active region 10. Since the second portion 120b of the first gate electrode structure extends over the first field insulating layer 105. It overlaps a portion of the first field insulating layer 105 as well as the second active region 20.

The third portion 120c of the first gate electrode structure does not extend over the first active region 10 and the second active region 20. The third portion 120c of the first gate electrode structure may not overlap the first active region 10 and the second active region 20, e.g., the third portion 120c of the first gate electrode structure may overlap only a portion of the first field insulating layer 105 between the first and second active regions 10 and 20. The third portion 120c of the first gate electrode structure is in contact with the first portion 120a of the first gate electrode structure and the second portion 120b of the first gate electrode structure on the first field insulating layer 105.

An interlayer insulating layer 190 may be formed on the substrate 100. The interlayer insulating layer 190 may include a first trench 120t. The first trench 120t may traverse the first active region 10, the first field insulating layer 105, and the second active region 20. The first trench 120t may be elongated in the second direction Y1. The interlayer insulating layer 190 may include at least one of, e.g., silicon oxide, silicon nitride, silicon oxynitride, and a low dielectric constant material having a dielectric constant smaller than that of silicon oxide.

A first short side spacer 140 and a first long side spacer 141 may be formed on the substrate 100. The first short side spacer 140 and the first long side spacer 141 may define the first trench 120t. The first short side spacer 140 may be formed on the short sidewall of the first gate electrode structure 120 (FIGS. 2A-2B), and the first long side spacer 141 may be formed on the long sidewall of the first gate electrode structure 120 (FIGS. 3A-3B).

In FIGS. 2A to 3B, the first short side spacer 140 is illustrated as being formed on the short sidewall of the first gate electrode structure 120, but the present disclosure is not limited thereto. Unlike the illustration, the first short side spacer 140 may not be formed on the short sidewall including the short side of the first gate electrode structure 120. For example, the thickness of the first long side spacer 141 on the long sidewall of the first gate electrode structure 120, e.g., along the X1 direction, may be different from the thickness of the first short side spacer 140 on the short sidewall of the first gate electrode structure 120, e.g., along the Y1 direction.

Each of the first short side spacer 140 and the first long side spacer 141 may include at least one of, e.g., silicon nitride (SiN), silicon oxynitride (SiON), silicon oxide ($SiO_2$), silicon oxynitride (SiOCN) and a combination thereof. The first short side spacer 140 may include the same material as the first long side spacer 141, or they may include different materials.

The first gate insulating layer 130 may be formed on the substrate 100. The first gate insulating layer 130 may be formed on the first active region 10, the second active region 20, and the first field insulating layer 105. The first gate insulating layer 130 may extend along the sidewall of the first trench 120t defined by the first short side spacer 140 and the sidewall of the first trench 120t defined by the first long side spacer 141 and the bottom surface of the first trench 120t. The first gate insulating layer 130 extending along the bottom surface of the first trench 120t may traverse the first active region 10, the first field insulating layer 105, and the second active region 20.

The first gate insulating layer 130 may include a high dielectric constant insulating layer. The high dielectric constant insulating layer may include, e.g., at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide and lead zinc niobate.

Unlike the illustration of FIGS. 2A and 3A, in FIGS. 2B and 3B, a first interfacial layer 131 and a second interfacial layer 132 may be formed between the first gate insulating layer 130 and the first active region 10, and between the first gate insulating layer 130 and the second active region 20, respectively. According to the forming method, the first and second interfacial layers 131 and 132 may be formed only on the first active region 10 and the second active region 20, respectively, or may be formed along the sidewall and bottom surface of the first trench 120t (i.e., the upper surface of the first field insulating layer 105, the sidewall of the first short side spacer 140 and the sidewall of the first long side spacer 141). Depending on the type of the substrate 100 or the type of the first gate insulating layer 130, the first and second interfacial layers 131 and 132 may include different materials. When the substrate 100 is a silicon substrate, the first and second interfacial layers 131 and 132 may include, e.g., silicon oxide. In FIGS. 2B and 3B, the upper surfaces of the first and second interfacial layers 131 and 132 are shown as being coplanar with the upper surface of the first field insulating layer 105, but the present disclosure is not limited thereto.

The first gate electrode structure 120 may be formed on the first gate insulating layer 130. The first gate insulating layer 130 may be formed between the first gate electrode structure 120 and the substrate 100. The first gate electrode structure 120 may fill the first trench 120t. The upper surface of the first gate electrode structure 120 may be coplanar with the upper surface of the first short side spacer 140, the upper surface of the first long side spacer 141, and the upper surface of the interlayer insulating layer 190.

The first gate electrode structure 120 may include a first work function adjusting layer 121, a first insertion layer 122 and a first filling layer 123 sequentially formed on the first gate insulating layer 130.

The first work function adjusting layer 121 may be formed on the first gate insulating layer 130. The first work function adjusting layer 121 may be formed on the first active region 10, the second active region 20, and the first field insulating layer 105. The first work function adjusting layer 121 may be in contact with the first gate insulating layer 130, for example. The first work function adjusting layer 121 may extend along the sidewall and the bottom surface of the first trench 120t. The first work function adjusting layer 121 may extend along the profile of the first gate insulating layer 130. The first work function adjusting layer 121 extending along the bottom surface of the first trench 120t may traverse the first active region 10, the first field insulating layer 105, and the second active region 20. The first work function adjusting layer 121 may include, e.g., titanium nitride (TiN).

A thickness t32 of the first work function adjusting layer 121, e.g., along the Z1 direction, in the third portion 120c of the first gate electrode structure may be smaller than a thickness t12 of the first work function adjusting layer 121 in the first portion 120a of the first gate electrode structure. Further, the thickness t32 of the first work function adjusting layer 121 in the third portion 120c of the first gate electrode structure may be greater than a thickness t22 of the first work function adjusting layer 121 in the second portion 120b of the first gate electrode structure.

The first work function adjusting layer 121 may include a lower surface in contact with the first gate insulating layer 130 and an upper surface corresponding, e.g., opposite, to the lower surface. The upper surface of the first work function adjusting layer 121 may face the first insertion layer 122. For example, on the first field insulating layer 105, the upper surface of the first work function adjusting layer 121 may have a stepped shape. On the first field insulating layer 105, a plurality of steps may be formed in the first work function adjusting layer 121. For example, as illustrated in FIGS. 2A and 2B, the lower surface of the first work function adjusting layer 121 may be substantially flat, and the upper surface of the first work function adjusting layer 121 may have a decreasing thickness from the first portion 120a of the first gate electrode structure to the second portion 120b of the first gate electrode structure, so the first work function adjusting layer 121 may have a stepped shape with decreasing steps, e.g., decreasing thickness relative to the lower surface of the first work function adjusting layer 121, from the first portion 120a to the second portion 120b.

In FIGS. 2A and 2B, the first portion 120a, the second portion 120b, and the third portion 120c included in the first gate electrode structure 120 may be defined and distinguished by changes in the thickness of the first work function adjusting layer 121. The thickness of the first work function adjusting layer 121 between the first active region 10 and the second active region 20 may be maintained at a constant thickness t32 and then reduced. Further, the thickness of the first work function adjusting layer 121 may be reduced and then maintained at another constant thickness t22.

The first insertion layer 122 may be, e.g., conformally, formed on the first work function adjusting layer 121. The first insertion layer 122 may be formed on the first active region 10, the second active region 20, and the first field insulating layer 105.

The first insertion layer 122 may extend along the sidewall and the bottom surface of the first trench 120t. The first insertion layer 122 may extend along the profile of the first work function adjusting layer 121. The first insertion layer 122 extending along the bottom surface of the first trench 120t may traverse the first active region 10, the first field insulating layer 105, and the second active region 20.

The first insertion layer 122 may include, e.g., at least one of titanium (Ti), titanium aluminum (TiAl), titanium aluminum nitride (TiAlN), titanium aluminum carbide (TiAlC), titanium aluminum carbonitride (TiAlCN). In the semiconductor device according to some embodiments of the present disclosure, the first insertion layer 122 is described as a layer including titanium aluminum (TiAl) or titanium aluminum carbide (TiAlC).

The first filling layer 123 may be formed on the first insertion layer 122, e.g., a bottom of the first filling layer 123 may be conformal on the first insertion layer 122 to trace the stepped shape of the upper surface of the first work function adjusting layer 121. The first filling layer 123 may be formed on the first active region 10, the second active region 20, and the first field insulating layer 105. The first filling layer 123 may include, e.g., at least one of tungsten (W), aluminum (Al), cobalt (Co), copper (Cu), ruthenium (Ru), nickel (Ni), platinum (Pt), nickel-platinum (Ni—Pt) and titanium nitride (TiN).

The first insertion layer 122 and the first filling layer 123 may be a first upper gate electrode 127 of the first gate electrode structure 120. For example, as illustrated in FIGS. 2A and 2B, uppermost surfaces of the first insertion layer 122, first filling layer 123, first work function adjusting layer 121, and first gate insulating layer 130 may be level with each other.

A thickness t31 of the first upper gate electrode 127 in the third portion 120c of the first gate electrode structure may be greater than a thickness t11 of the first upper gate electrode 127 in the first portion 120a of the first gate electrode structure. Further, the thickness t31 of the first upper gate electrode 127 in the third portion 120c of the first gate electrode structure may be smaller than a thickness t21 of the first upper gate electrode 127 in the second portion 120b of the first gate electrode structure. The thicknesses t11, t21 and t31 of the first upper gate electrode 127 may be a distance from the upper surface of the interlayer insulating layer 190 to the upper surface of the first work function adjusting layer 121 of the bottom surface of the first trench 120t, e.g., so the different thicknesses t11, t21 and t31 are measured from a same level to the stepped shape of the upper surface of the first work function adjusting layer 121.

As illustrated in FIGS. 3A and 3B, a first source/drain 150 may be formed on both sides of the first portion 120a of the first gate electrode structure, and a second source/drain 155 may be formed on both sides of the second portion 120b of the first gate electrode structure. The first source/drain 150 and the second source/drain 155 may include an epitaxial layer formed in the substrate 100, but the present disclosure is not limited thereto. The first source/drain 150 and the second source/drain 155 may be an impurity region formed by implanting impurities into the substrate 100. The first source/drain 150 and the second source/drain 155 may be an elevated source/drain including an upper surface protruding upward from the upper surface of the substrate 100.

Figure 4:
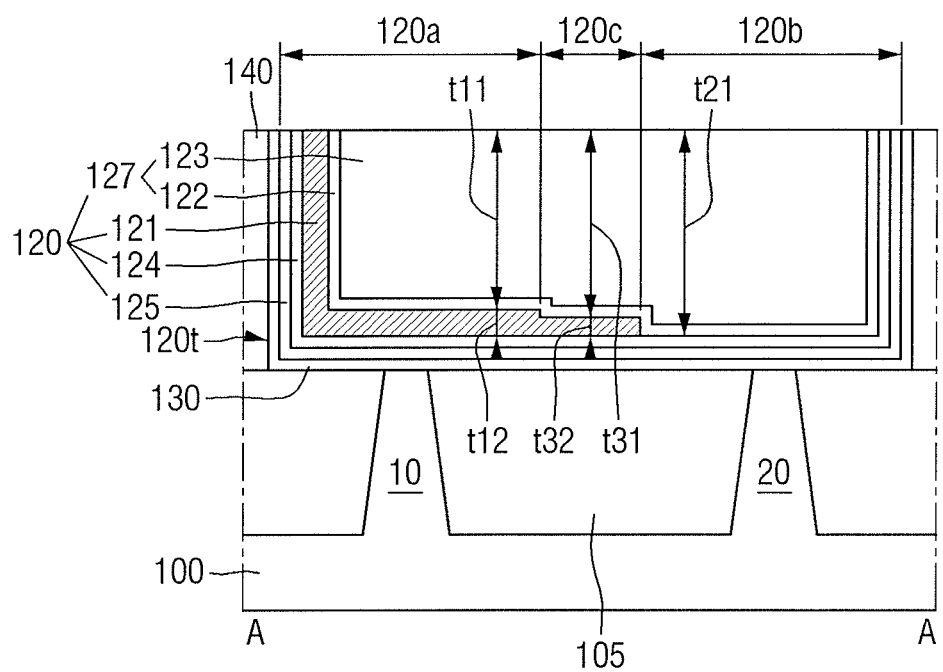
FIGS. 4 and 5 illustrate views of a semiconductor device according to some embodiments of the present disclosure.
Figure 5:
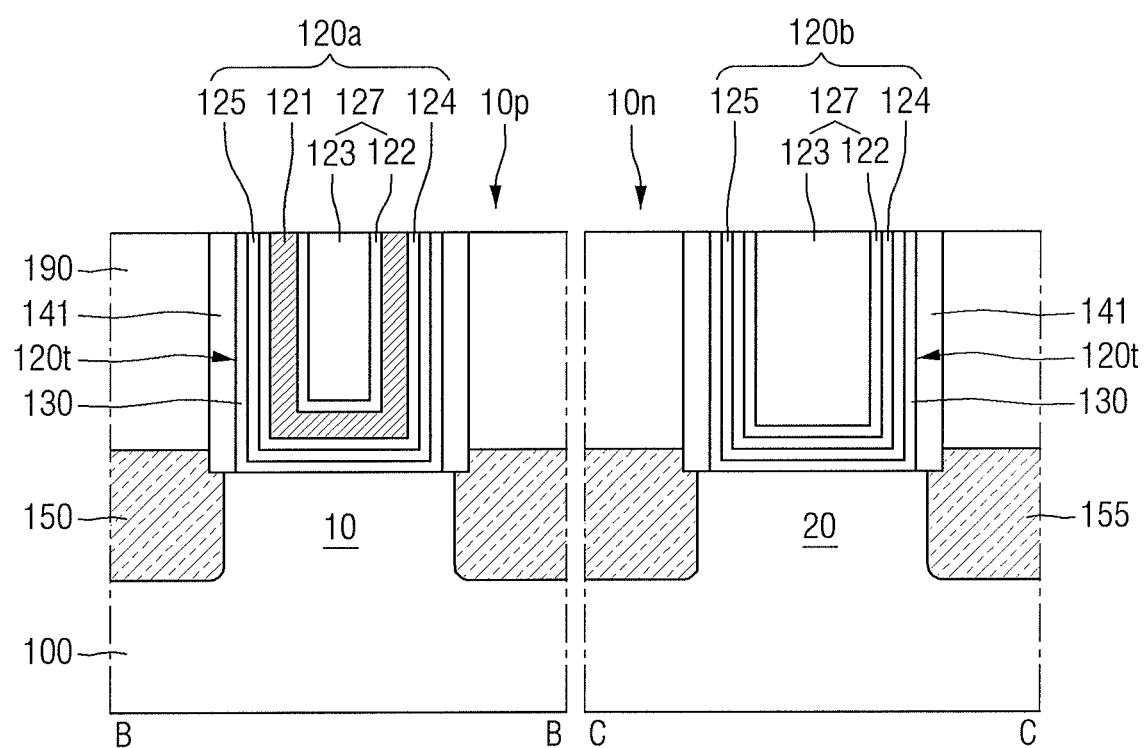

FIGS. 4 and 5 are views illustrating a semiconductor device according to some embodiments of the present disclosure. For simplicity of description, differences relative to the description of FIGS. 1 to 3B will be mainly described below.

Referring to FIGS. 4 and 5, in the semiconductor device according to some embodiments of the present disclosure, the first gate electrode structure 120 may further include a lower conductive layer 125 and an etch stop layer 124 between the first gate insulating layer 130 and the first work function adjusting layer 121. The lower conductive layer 125, the etch stop layer 124, and the first work function adjusting layer 121 may be sequentially formed on the substrate 100.

The lower conductive layer 125 may be formed on the first gate insulating layer 130. The lower conductive layer 125 may be formed on the first active region 10, the second active region 20, and the first field insulating layer 105. The lower conductive layer 125 may extend along the sidewall and the bottom surface of the first trench 120t. The lower conductive layer 125 may extend along the profile of the first gate insulating layer 130. The lower conductive layer 125 may include at least one of, e.g., titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN) and tantalum aluminum nitride (TaAlN). In the semiconductor device according to some embodiments of the present disclosure, the lower conductive layer 125 is described as including titanium nitride (TiN).

The etch stop layer 124 may be formed on the lower conductive layer 125. The etch stop layer 124 may be formed on the first active region 10, the second active region 20, and the first field insulating layer 105. The etch stop layer 124 may extend along the sidewall and the bottom surface of the first trench 120t. The etch stop layer 124 may extend along the profile of the lower conductive layer 125. The etch stop layer 124 may include at least one of, e.g., titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN) and tantalum aluminum nitride (TaAlN). In the semiconductor device according to some embodiments of the present disclosure, the etch stop layer 124 is described as including tantalum nitride (TaN).

The lower conductive layer 125 and the etch stop layer 124 extending along the bottom surface of the first trench 120t may traverse in the first active region 10, the first field insulating layer 105, and the second active region 20.

The first work function adjusting layer 121 may not be formed on the second active region 20. The first work function adjusting layer 121 may be formed over the first active region 10 and the first field insulating layer 105 but may not overlap the second active region 20. The first work function adjusting layer 121 may not extend onto the second active region 20. In other words, the second portion 120b of the first gate electrode structure formed on the second active region 20 and the first field insulating layer 105 may not include the first work function adjusting layer 121.

In the second portion 120b of the first gate electrode structure, the etch stop layer 124 may be in contact with the first insertion layer 122. In the second portion 120b of the first gate electrode structure, the etch stop layer 124 may be in contact with the first upper gate electrode 127.

Figure 6:
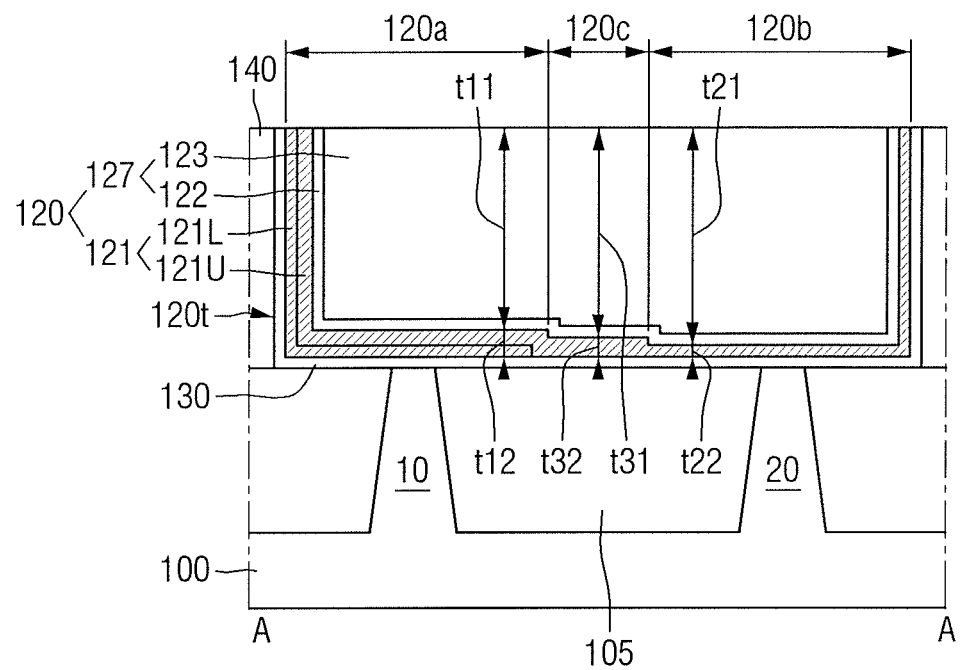
FIGS. 6 to 8 illustrate views of a semiconductor device according to some embodiments of the present disclosure.
Figure 7:
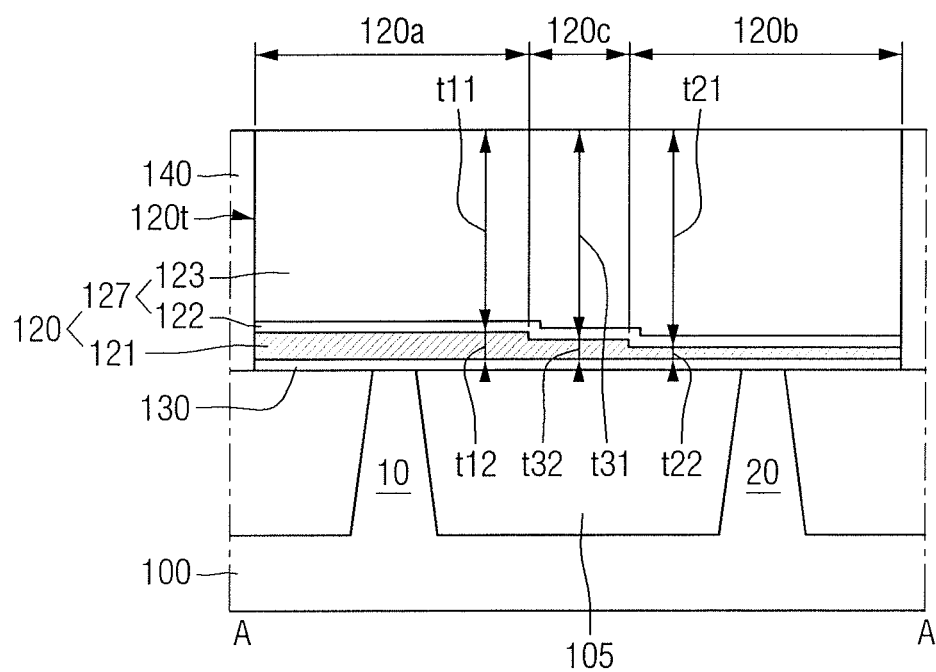
Figure 8:
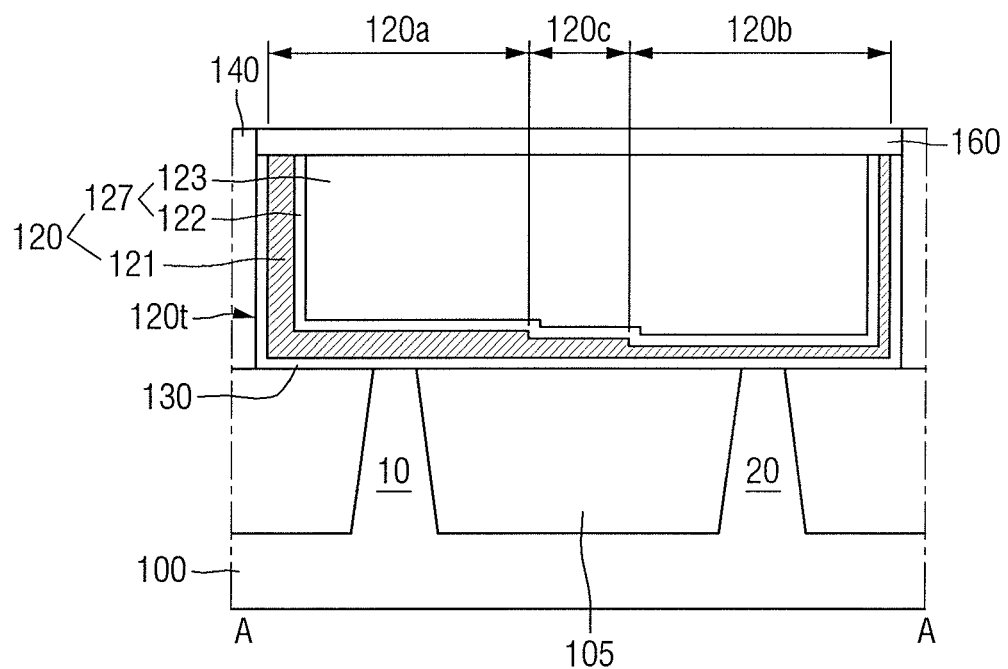

FIGS. 6 to 8 are views illustrating a semiconductor device according to some embodiments of the present disclosure. For simplicity of description, differences relative to FIGS. 1 to 3B will be mainly described below.

Referring to FIG. 6, in the semiconductor device according to some embodiments of the present disclosure, the first work function adjusting layer 121 may include a lower work function adjusting layer 121L and an upper work function adjusting layer 121U.

The lower work function adjusting layer 121L may not be formed on the second active region 20. The lower work function adjusting layer 121L may be formed over the first active region 10 and the first field insulating layer 105, but may not overlap the second active region 20. The lower work function adjusting layer 121L may not extend onto the second active region 20.

The lower work function adjusting layer 121L may be included in the first portion 120a of the first gate electrode structure, but may not be included in the second portion 120b of the first gate electrode structure and the third portion 120c of the first gate electrode structure.

The upper work function adjusting layer 121U may be formed on the lower work function adjusting layer 121L. The upper work function adjusting layer 121U may be in contact with the lower work function adjusting layer 121L. The upper work function adjusting layer 121U may be formed on the first active region 10, the second active region 20, and the first field insulating layer 105. The upper work function adjusting layer 121U may be included in the first portion 120a of the first gate electrode structure, the second portion 120b of the first gate electrode structure, and the third portion 120c of the first gate electrode structure.

The thickness t12 of the first work function adjusting layer 121 in the first portion 120a of the first gate electrode structure may be the sum of the thickness of the lower work function adjusting layer 121L and the thickness of the upper work function adjusting layer 121U. On the other hand, the thickness t22 of the first work function adjusting layer 121 in the second portion 120b of the first gate electrode structure and the thickness t32 of the first work function adjusting layer 121 in the third portion 120c of the first gate electrode structure may be the thickness of the upper work function adjusting layer 121U. The thickness of the upper work function adjusting layer 121U in the first portion 120a of the first gate electrode structure is greater than the thickness of the upper work function adjusting layer 121U in the second portion 120b of the first gate electrode structure.

The lower work function adjusting layer 121L and the upper work function adjusting layer 121U may include the same material. For example, the lower work function adjusting layer 121L and the upper work function adjusting layer 121U may include titanium nitride (TiN).

Before forming the upper work function adjusting layer 121U, a thermal annealing process or the like may be performed on the lower work function adjusting layer 121L. Thus, an interface between the lower work function adjusting layer 121L and the upper work function adjusting layer 121U including the same material can be seen.

Referring to FIG. 7, in the semiconductor device according to some embodiments of the present disclosure, the first gate insulating layer 130, the first work function adjusting layer 121, and the first insertion layer 122 may not be formed along the sidewall of the first trench 120t defined by the first short side spacer 140.

On the other hand, the first gate insulating layer 130, the first work function adjusting layer 121 and the first insertion layer 122 may be formed along the sidewall of the first trench 120t defined by the first long side spacer 141 (see FIG. 3A).

For example, after a gate electrode and a gate insulating layer are formed through a replacement process (or a gate last process), when a portion of the gate insulating layer and a portion of the gate electrode formed along the sidewall of the first trench 120t defined by the first short side spacer 140 are removed, the first gate insulating layer 130 and the first gate electrode structure 120 as shown in FIG. 7 may be formed.

Referring to FIG. 8, the semiconductor device according to some embodiments of the present disclosure may further include a capping pattern 160. The first gate electrode structure 120 may fill a portion of the first trench 120t. The upper surface of the first gate electrode structure 120 may be recessed from the upper surface of the interlayer insulating layer 190.

The capping pattern 160 may be formed on the first gate electrode structure 120.

The capping pattern 160 may be formed on the first upper gate electrode 127. The capping pattern 160 may fill the remaining portion of the first trench 120t after being filled with the first gate electrode structure 120. Since the capping pattern 160 is formed by filling a portion of the first trench 120t, the upper surface of the capping pattern 160 may be coplanar with the upper surface of the first short side spacer 140, the upper surface of the first long side spacer 141 (see FIG. 3A) and the upper surface of the interlayer insulating layer 190.

The capping pattern 160 may include, e.g., at least one of silicon nitride (SiN), silicon oxynitride (SiON), silicon oxide (SiO$_2$), silicon carbonitride (SiCN), silicon carbide nitride (SiOCN) and a combination thereof.

Unlike the illustration, the first gate insulating layer 130 may extend between the first short side spacer 140 and the capping pattern 160. That is, a portion of the first gate insulating layer 130 may extend between the inner sidewall of the first short side spacer 140 and the capping pattern 160 facing each other.

Figure 9:
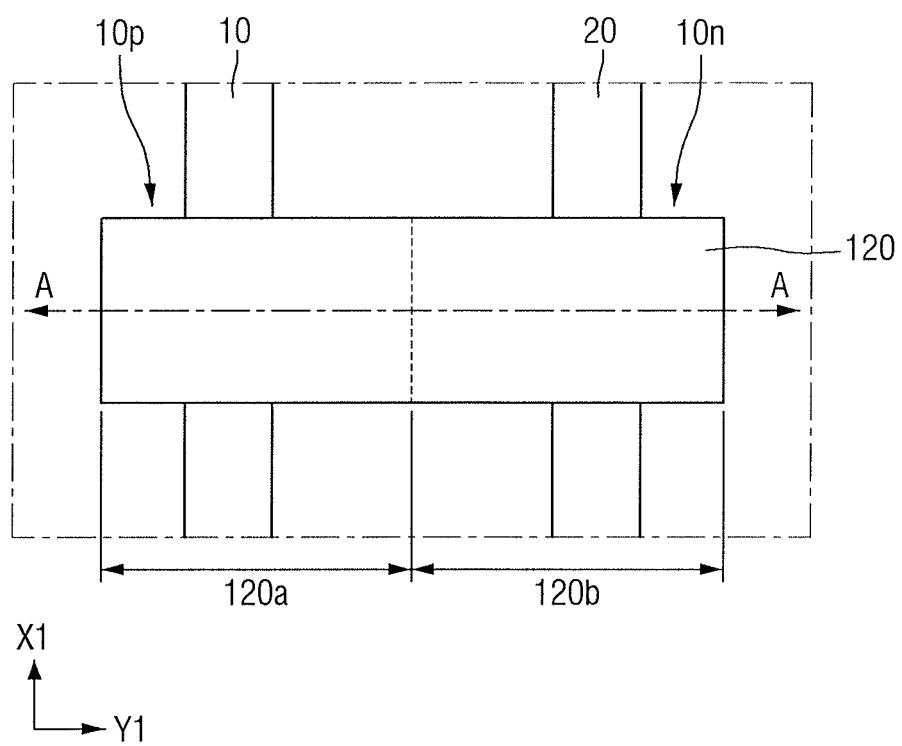
FIGS. 9 and 10 illustrate views of a semiconductor device according to some embodiments of the present disclosure.
Figure 10:
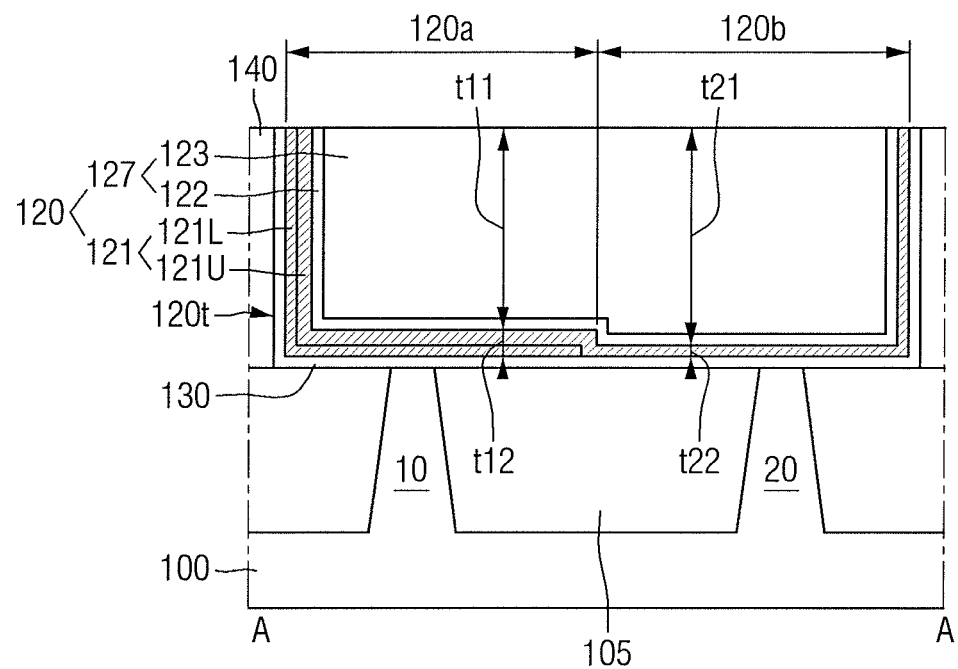

FIGS. 9 and 10 are views illustrating a semiconductor device according to some embodiments of the present disclosure. For simplicity of description, differences relative to FIG. 6 will be mainly described. FIG. 10 is a cross-sectional view along line A-A of FIG. 9.

Referring to FIGS. 9 and 10, in the semiconductor device according to some embodiments of the present disclosure, the first gate electrode structure 120 may not include the third portion 120c (see FIG. 6) of the first gate electrode structure. For example, the first portion 120a of the first gate electrode structure may be in, e.g., direct, contact with the second portion 120b of the first gate electrode structure.

Figure 11:
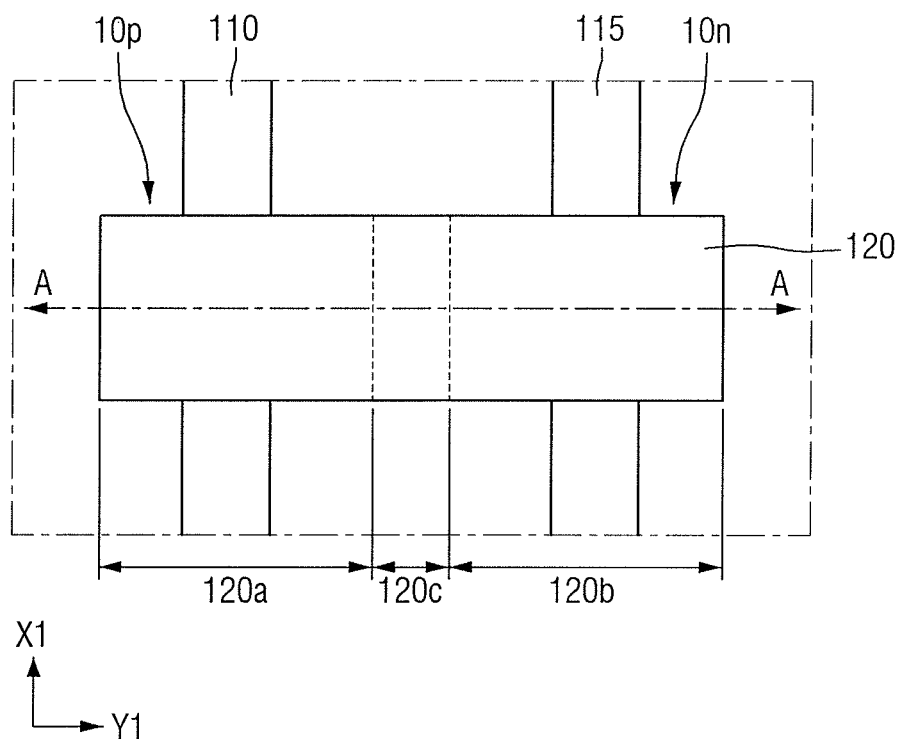
FIG. 11 illustrates a plan view of a semiconductor device according to some embodiments of the present disclosure.
Figure 12:
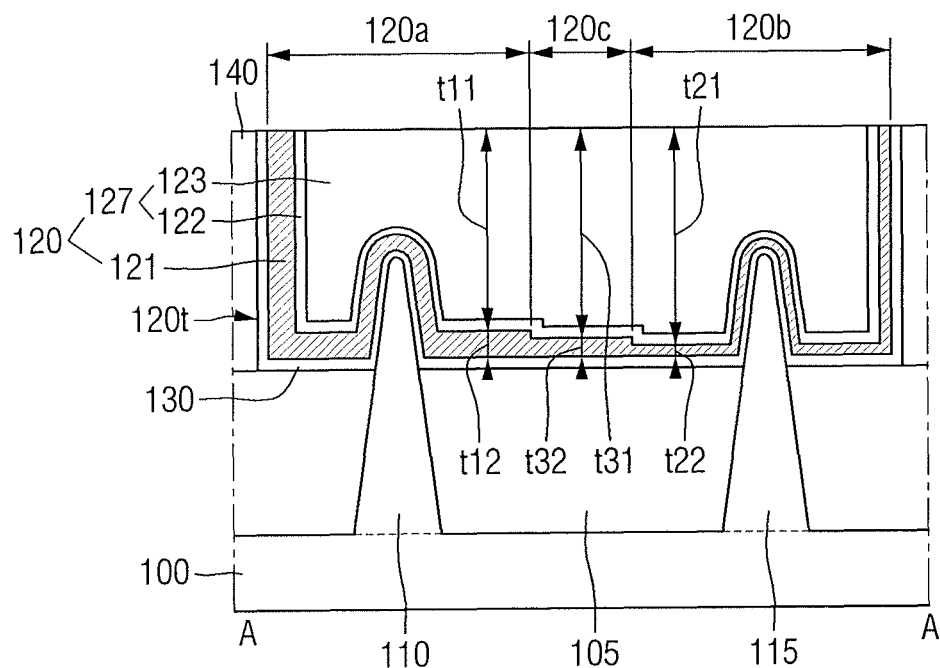
FIG. 12 illustrates a cross-sectional view along line A-A of FIG. 11.

FIG. 11 is a plan view illustrating a semiconductor device according to some embodiments of the present disclosure. FIG. 12 is a cross-sectional view taken along line A-A of FIG. 11. For simplicity of description, differences relative to FIGS. 1 to 3B will be mainly described.

For reference, since FIG. 12 is substantially the same as FIG. 2A, except for the description of a fin-shaped pattern, a repeated description will be omitted or briefly explained. That is, a first fin-shaped pattern 110 may correspond to the first active region 10 and a second fin-shaped pattern 115 may correspond to the second active region 20. In addition, although FIG. 12 is represented as a figure similar to FIG. 2A, it is not limited thereto. FIG. 12 may be similar to one of FIGS. 2B, 6 to 8 and 10.

Referring to FIGS. 11 and 12, the semiconductor device according to some embodiments of the present disclosure includes the first fin-shaped pattern 110, the second fin-shaped pattern 115 adjacent to the first fin-shaped pattern 110, the first field insulating layer 105 between the first and second fin-shaped patterns 110 and 115, and the first gate electrode structure 120 traversing the first fin-shaped pattern 110, the first field insulating layer 105, and the second fin-shaped pattern 115.

The first fin-shaped pattern 110 and the second fin-shaped pattern 115 may protrude from the substrate 100. Each of the first fin-shaped pattern 110 and the second fin-shaped pattern 115 may be elongated in the first direction X1. For example, the first fin-shaped pattern 110 may be a region where a PMOS is formed, and the second fin-shaped pattern 115 may be a region where an NMOS is formed.

The first fin-shaped pattern 110 and the second fin-shaped pattern 115 may be a portion of the substrate 100 and may include an epitaxial layer grown from the substrate 100. Each of the first fin-shaped pattern 110 and the second fin-shaped pattern 115 may include, e.g., silicon or germanium, which is an elemental semiconductor material. Further, each of the first fin-shaped pattern 110 and the second fin-shaped pattern 115 may include a compound semiconductor, and may include, e.g., a IV-IV compound semiconductor or III-V compound semiconductor. For example, in the case of including a IV-IV compound semiconductor, each of the first fin-shaped pattern 110 and the second fin-shaped pattern 115 may be a binary compound, a ternary compound, or a compound doped with group IV elements, the compound containing at least two of carbon (C), silicon (Si), germanium (Ge) and tin (Sn). In the case of including a III-V compound semiconductor, each of the first fin-shaped pattern 110 and the second fin-shaped pattern 115 may be a binary compound, a ternary compound or a quaternary compound formed by combining at least one of group III elements of aluminum (Al), gallium (Ga) and indium (In) with one of group V elements of phosphorus (P), arsenic (As) and antimony (Sb). Hereinafter, a case where each of the first fin-shaped pattern 110 and the second fin-shaped pattern 115 is a silicon fin-shaped pattern will be described.

Since the first field insulating layer 105 covers a portion of the sidewall of the first fin-shaped pattern 110 and a portion of the sidewall of the second fin-shaped pattern 115, the first fin-shaped pattern 110 and the second fin-shaped pattern 115 may protrude above the upper surface of the first field insulating layer 105 formed on the substrate 100. The first fin-shaped pattern 110 and the second fin-shaped pattern 115 are spatially separated, but are adjacent to each other.

The first field insulating layer 105 may be disposed between the first fin-shaped pattern 110 and the second fin-shaped pattern 115 and may be in contact with the first fin-shaped pattern 110 and the second fin-shaped pattern 115. The first field insulating layer 105 being in contact with the first fin-shaped pattern 110 and the second fin-shaped pattern 115 means that a fin-shaped pattern protruding above the upper surface of the first field insulating layer 105 is not interposed between the first fin-shaped pattern 110 and the second fin-shaped pattern 115.

The first gate electrode structure 120 may traverse the first fin-shaped pattern 110, the second fin-shaped pattern 115, and the first field insulating layer 105. The first gate electrode structure 120 may be elongated in the second direction Y1. The first gate electrode structure 120 may intersect the first fin-shaped pattern 110 and the second fin-shaped pattern 115.

The first portion 120a of the first gate electrode structure may be formed on the first fin-shaped pattern 110 and the first field insulating layer 105. The first portion 120a of the first gate electrode structure may be formed over the first fin-shaped pattern 110 and the first field insulating layer 105. The second portion 120b of the first gate electrode structure may be formed on the second fin-shaped pattern 115 and the first field insulating layer 105. The second portion 120b of the first gate electrode structure may be formed over the second fin-shaped pattern 115 and the first field insulating layer 105. The third portion 120c of the first gate electrode structure does not intersect the first fin-shaped pattern 110 and the second fin-shaped pattern 115. The third portion 120c of the first gate electrode structure is not formed on the first fin-shaped pattern 110 and the second fin-shaped pattern 115.

The first gate insulating layer 130 may be formed on the first fin-shaped pattern 110, the second fin-shaped pattern 115, and the first field insulating layer 105. The first gate insulating layer 130 extending along the bottom surface of the first trench 120t may be formed on the upper surface of the first field insulating layer 105, the profile of the first fin-shaped pattern 110, and the profile of the second fin-shaped pattern 115.

The first gate electrode structure 120 may be formed on the first gate insulating layer 130. The first work function adjusting layer 121 and the first insertion layer 122 may be formed along the profile of the first gate insulating layer 130.

In FIG. 12, the thickness of the first work function adjusting layer 121 and the thickness of the first upper gate electrode 127 may be measured on the first field insulating layer 105 between the first fin-shaped pattern 110 and the second fin-shaped pattern 115, respectively.

Figure 13:
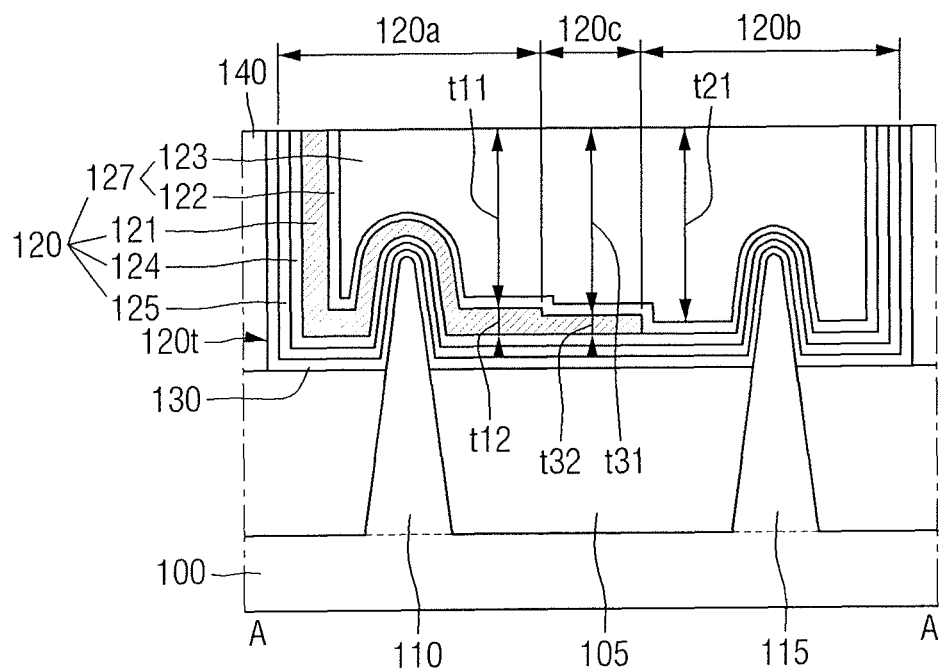
FIGS. 13 to 15 illustrate views of a semiconductor device according to some embodiments of the present disclosure.
Figure 14:
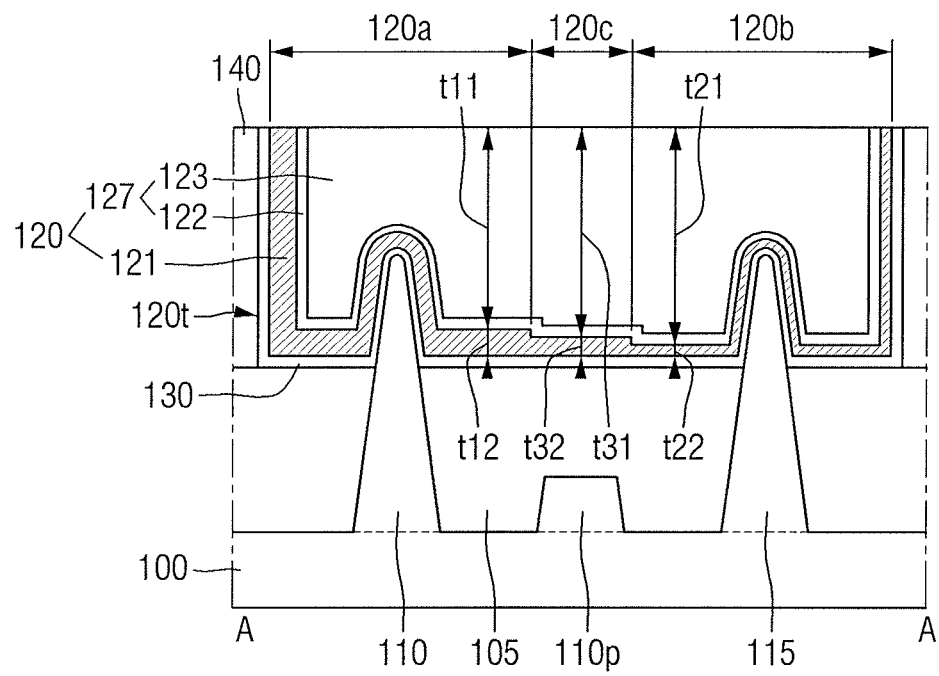
Figure 15:
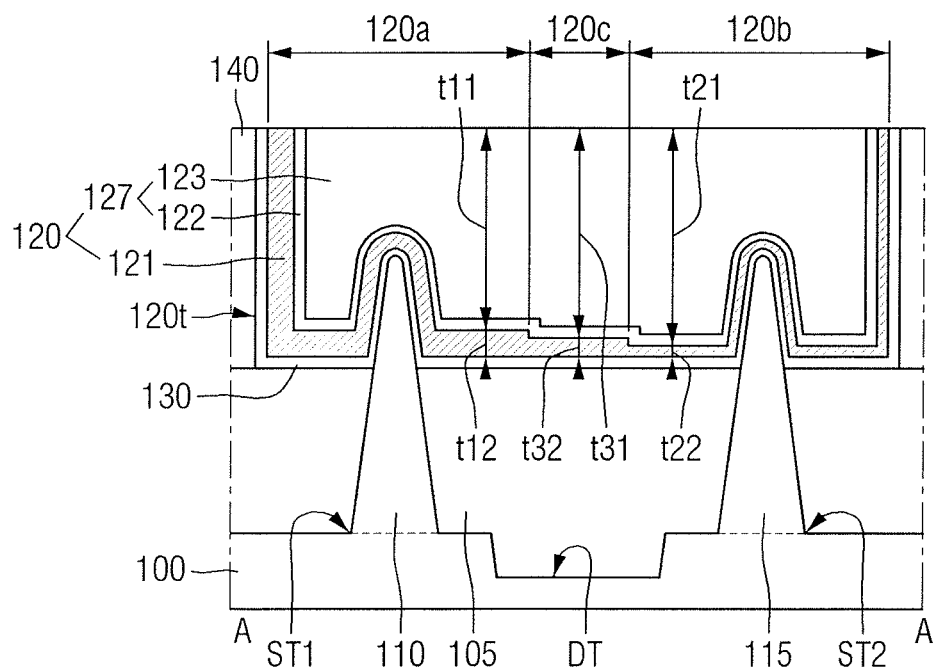

FIGS. 13 to 15 are views illustrating a semiconductor device according to some embodiments of the present disclosure. For simplicity of description, differences relative to FIGS. 11 and 12 will be mainly described.

Referring to FIG. 13, in the semiconductor device according to some embodiments of the present disclosure, the first gate electrode structure 120 may further include the lower conductive layer 125 and the etch stop layer 124 between the first gate insulating layer 130 and the first work function adjusting layer 121. The lower conductive layer 125 and the etch stop layer 124 may be formed along the profile of the first gate insulating layer 130.

The first work function adjusting layer 121 may not be formed on the second fin-shaped pattern 115. The first work function adjusting layer 121 may not extend along the profile of the second fin-shaped pattern 115 protruding above the upper surface of the first field insulating layer 105. The second portion 120b of the first gate electrode structure may not include the first work function adjusting layer 121. In the second portion 120b of the first gate electrode structure, the etch stop layer 124 may be in contact with the first insertion layer 122.

Referring to FIG. 14, the semiconductor device according to some embodiments of the present disclosure may further include a fin-shaped protrusion 110p located between the first fin-shaped pattern 110 and the second fin-shaped pattern 115.

The fin-shaped protrusion 110p may extend in the first direction X1, similarly to the first fin-shaped pattern 110 and the second tin-shaped pattern 115. The fin-shaped protrusion 110p may include the same material as the first fin-shaped pattern 110 and the second fin-shaped pattern 115. The first field insulating layer 105 may cover the upper surface of the fin-shaped protrusion 110p.

Referring to FIG. 15, in the semiconductor device according to some embodiments of the present disclosure, a deep trench DT may be formed between the first fin-shaped pattern 110 and the second fin-shaped pattern 115.

The first fin-shaped pattern 110 may be defined by a first shallow trench ST1, and the second fin-shaped pattern 115 may be defined by a second shallow trench ST2. The deep trench DT may be deeper than the first shallow trench ST1 and the second shallow trench ST2.

Figure 16:
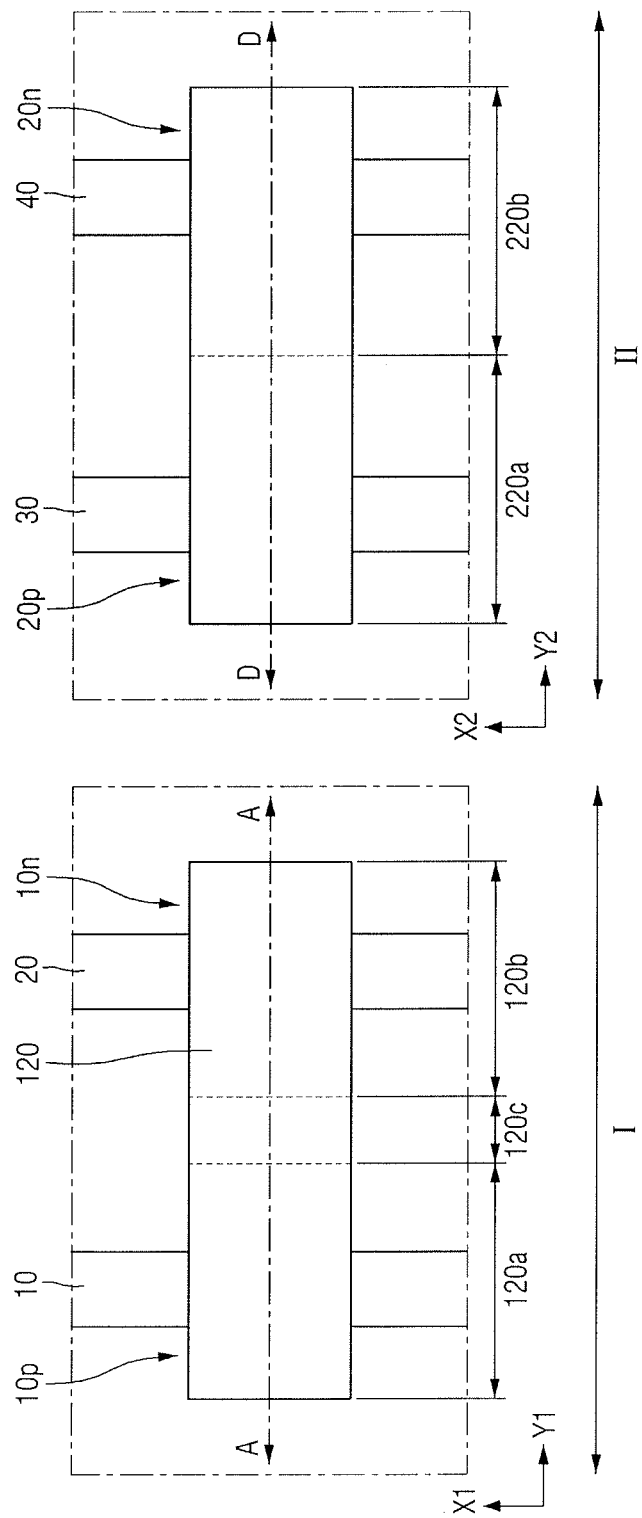
FIG. 16 illustrates a plan view of a semiconductor device according to some embodiments of the present disclosure.
Figure 17:
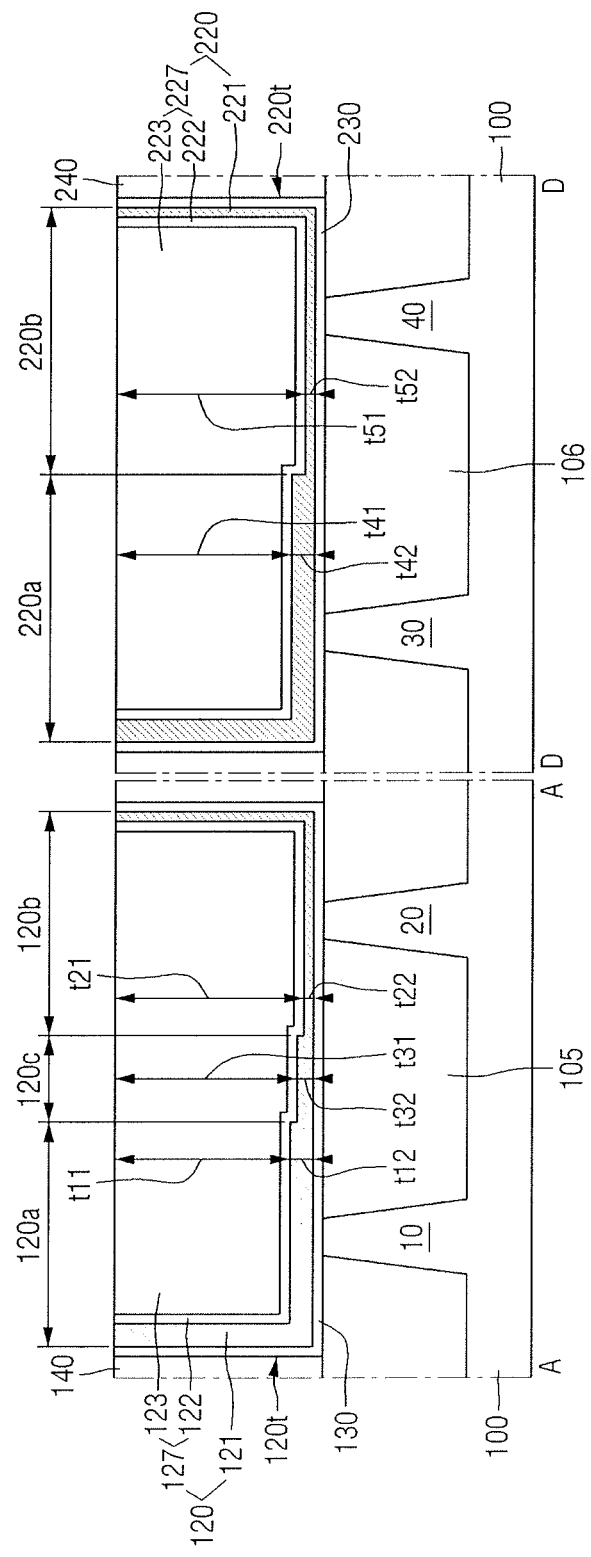
FIG. 17 illustrates a cross-sectional view along lines A-A and D-D of FIG. 16.

FIG. 16 is a plan view illustrating a semiconductor device according to some embodiments of the present disclosure. FIG. 17 is a cross-sectional view taken along lines A-A and D-D of FIG. 16. Since the first active region 10, the second active region 20, and the first gate electrode structure 120 shown in a first region I of FIGS. 16 and 17 are the same as those described with reference to FIGS. 1 to 3B, a description of FIGS. 16 and 17 will be focused on those shown in a second region II.

Referring to FIGS. 16 and 17, the semiconductor device according to some embodiments of the present disclosure may include the substrate 100 including the first region I and the second region II, the first gate electrode structure 120 formed in the first region I and a second gate electrode structure 220 formed in the second region II.

The substrate 100 may include the first active region 10, the second active region 20, a third active region 30, a fourth active region 40, the first field insulating layer 105, and a second field insulating layer 106. The substrate 100 of the first region I may include the first active region 10, the second active region 20, and the first field insulating layer 105. The substrate 100 of the second region II may include the third active region 30, the fourth active region 40, and the second field insulating layer 106.

The third active region 30 and the fourth active region 40 may be defined by the second field insulating layer 106. The third active region 30 and the fourth active region 40 are spatially separated, but are adjacent to each other. The third active region 30 and the fourth active region 40 may have a rectangular shape elongated in a third direction X2, but the present disclosure is not limited thereto. In the semiconductor device according to some embodiments of the present disclosure, the third active region 30 may be a region in which a PMOS is formed, and the fourth active region 40 may be a region in which an NMOS is formed.

The second field insulating layer 106 may be formed to surround the third active region 30 and the fourth active region 40. However, in the semiconductor device according to some embodiments of the present disclosure, the second field insulating layer 106 refers to a portion located between the third active region 30 and the fourth active region 40. The second field insulating layer 106 may be disposed between the third active region 30 and the fourth active region 40 and may be in contact with the third active region 30 and the fourth active region 40.

The second gate electrode structure 220 may traverse the third active region 30, the fourth active region 40, and the second field insulating layer 106. The second gate electrode structure 220 may be elongated in a fourth direction Y2. The second gate electrode structure 220 may include a short sidewall including a short side extending in the third direction X2 and a long sidewall including a long side extending in the fourth direction Y2. The second gate electrode structure 220 may include a first portion 220a and a second portion 220b. The first portion 220a of the second gate electrode structure is in contact with the second portion 220b of the second gate electrode structure.

The first portion 220a of the second gate electrode structure may be a p-type metallic gate electrode. The first portion 220a of the second gate electrode structure may be formed on the third active region 30 and the second field insulating layer 106. The first portion 220a of the second gate electrode structure may be formed over the third active region 30 and the second field insulating layer 106. The second portion 220b of the second gate electrode structure may be an n-type metallic gate electrode. The second portion 220b of the second gate electrode structure may be formed on the fourth active region 40 and the second field insulating layer 106. The second portion 220b of the second gate electrode structure may be formed over the fourth active region 40 and the second field insulating layer 106. A third transistor 20p may be formed in a region where the third active region 30 and the second gate electrode structure 220 cross each other, and a fourth transistor 20n may be formed in a region where the fourth active region 40 and the second gate electrode structure 220 cross each other.

The interlayer insulating layer 190 may include the first trench 120t formed in the first region I and a second trench 220t formed in the second region II. The second trench 220t may traverse the third active region 30, the second field insulating layer 106, and the fourth active region 40.

A second short side spacer 240 may be formed on the substrate 100. The second short side spacer 240 may define a portion of the sidewall of the second trench 220t. The second short side spacer 240 may be formed on the short sidewall of the second gate electrode structure 220.

A second gate insulating layer 230 may be formed on the substrate 100. The second gate insulating layer 230 may be formed on the third active region 30, the fourth active region 40, and the second field insulating layer 106. The second gate insulating layer 230 may extend along the sidewall and the bottom surface of the second trench 220t. The second gate insulating layer 230 extending along the bottom surface of the second trench 220t may traverse the third active region 30, the second field insulating layer 106, and the fourth active region 40.

The second gate electrode structure 220 may be formed on the second gate insulating layer 230. The second gate insulating layer 230 may be formed between the second gate electrode structure 220 and the substrate 100. The second gate electrode structure 220 may fill the second trench 220t. The second gate electrode structure 220 may include a second work function adjusting layer 221, a second insertion layer 222 and a second filling layer 223 sequentially formed on the second gate insulating layer 230.

The second work function adjusting layer 221 may be formed on the third active region 30, the fourth active region 40, and the second field insulating layer 106. The second work function adjusting layer 221 may be in contact with the second gate insulating layer 230, for example. The second work function adjusting layer 221 may extend along the profile of the second gate insulating layer 230. The second work function adjusting layer 221 extending along the bottom surface of the second trench 220t may traverse the third active region 30, the second field insulating layer 106, and the fourth active region 40. The second work function adjusting layer 221 may include, e.g., titanium nitride (TiN).

A thickness t42 of the second work function adjusting layer 221 in the first portion 220a of the second gate electrode structure may be different from a thickness t52 of the second work function adjusting layer 221 in the second portion 220b of the second gate electrode structure. For example, the thickness t42 of the second work function adjusting layer 221 in the first portion 220a of the second gate electrode structure may be greater than the thickness t52 of the second work function adjusting layer 221 in the second portion 220b of the second gate electrode structure.

The second insertion layer 222 may be formed on the second work function adjusting layer 221. The second insertion layer 222 may be formed on the third active region 30, the fourth active region 40 and the second field insulating layer 106. The second insertion layer 222 may extend along the profile of the second work function adjusting layer 221. The second insertion layer 222 extending along the bottom surface of the second trench 220t may traverse the third active region 30, the second field insulating layer 106 and the fourth active region 40. The first insertion layer 122 and the second insertion layer 222 may include the same material.

The second filling layer 223 may be formed on the second insertion layer 222. The second filling layer 223 may be formed on the third active region 30, the fourth active region 40 and the second field insulating layer 106. The first filling layer 123 and the second filling layer 223 may include the same material.

The second insertion layer 222 and the second filling layer 223 may be a second upper gate electrode 227 of the second gate electrode structure 220.

A thickness t41 of the second upper gate electrode 227 in the first portion 220a of the second gate electrode structure may be different from a thickness t51 of the second upper gate electrode 227 in the second portion 220b of the second gate electrode structure. For example, the thickness t41 of the second upper gate electrode 227 in the first portion 220a of the second gate electrode structure may be smaller than the thickness t51 of the second upper gate electrode 227 in the second portion 220b of the second gate electrode structure.

Figure 18:
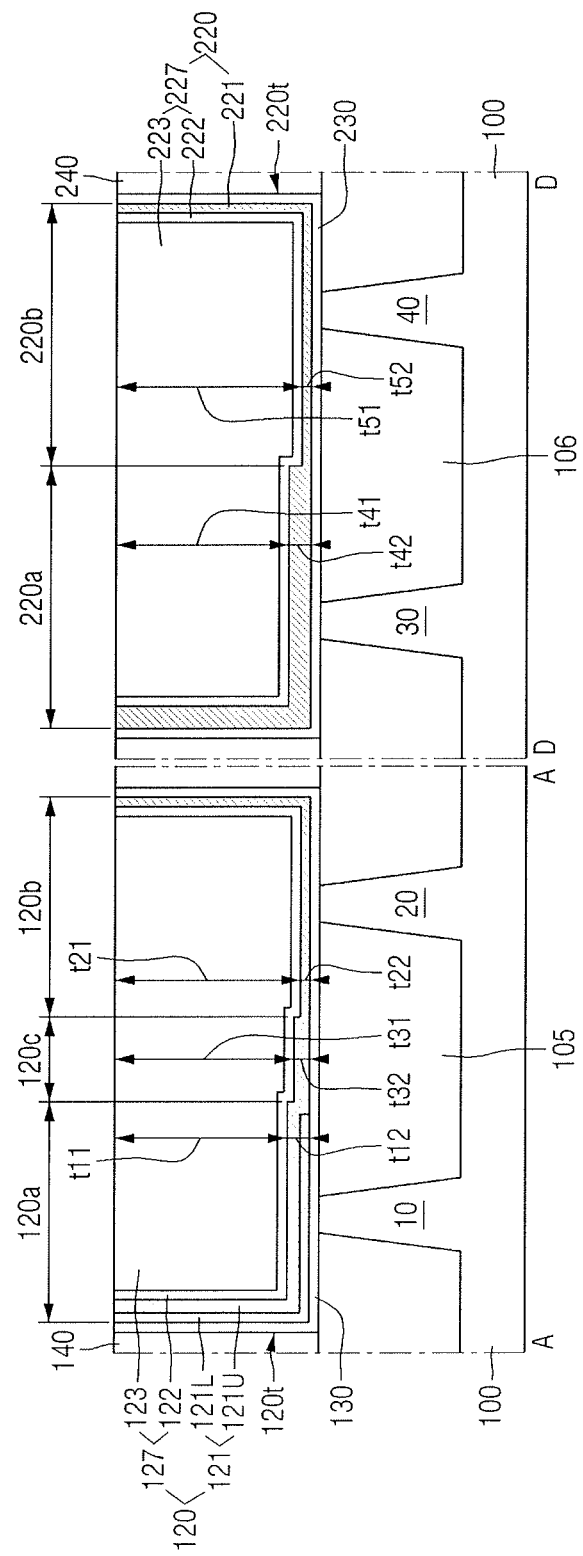
FIG. 18 illustrates a view of a semiconductor device according to some embodiments of the present disclosure.

FIG. 18 is a view illustrating a semiconductor device according to some embodiments of the present disclosure. For simplicity of description, differences relative to FIGS. 16 and 17 will be mainly described.

Referring to FIG. 18, in the semiconductor device according to some embodiments of the present disclosure, the first work function adjusting layer 121 may include a plurality of layers whose boundaries are distinguishable. However, the second work function adjusting layer 221 may be a single layer.

The first work function adjusting layer 121 may include a lower work function adjusting layer 121L and an upper work function adjusting layer 121U. The lower work function adjusting layer 121L may be included in the first portion 120a of the first gate electrode structure, but may not be included in the second portion 120b of the first gate electrode structure and the third portion 120c of the first gate electrode structure. The upper work function adjusting layer 121U may be formed on the lower work function adjusting layer 121L. The upper work function adjusting layer 121U may be in contact with the lower work function adjusting layer 121L. The upper work function adjusting layer 121U may be included in the first portion 120a of the first gate electrode structure, the second portion 120b of the first gate electrode structure and the third portion 120c of the first gate electrode structure.

The lower work function adjusting layer 121L, the upper work function adjusting layer 121U and the second work function adjusting layer 221 may include, for example, titanium nitride (TiN).

Figure 19:
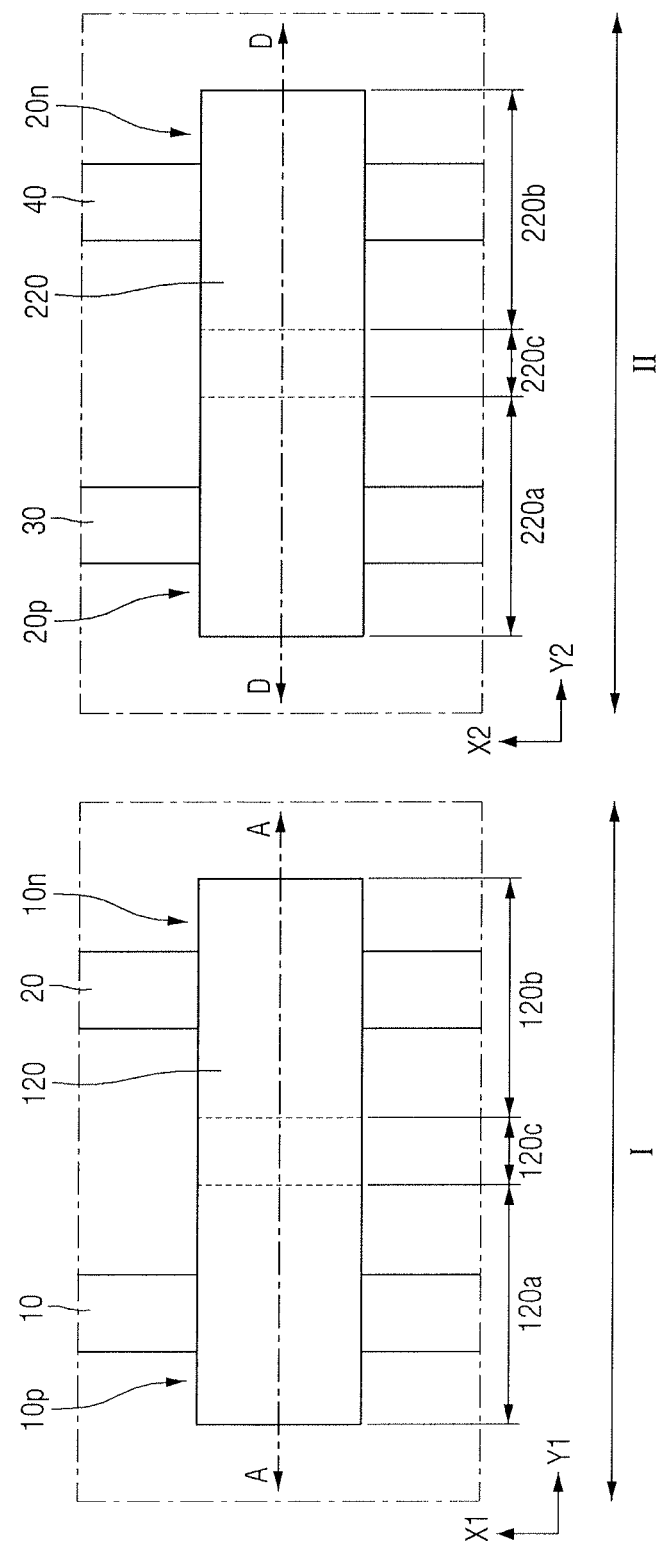
FIGS. 19 and 20 illustrate views of a semiconductor device according to some embodiments of the present disclosure.
Figure 20:
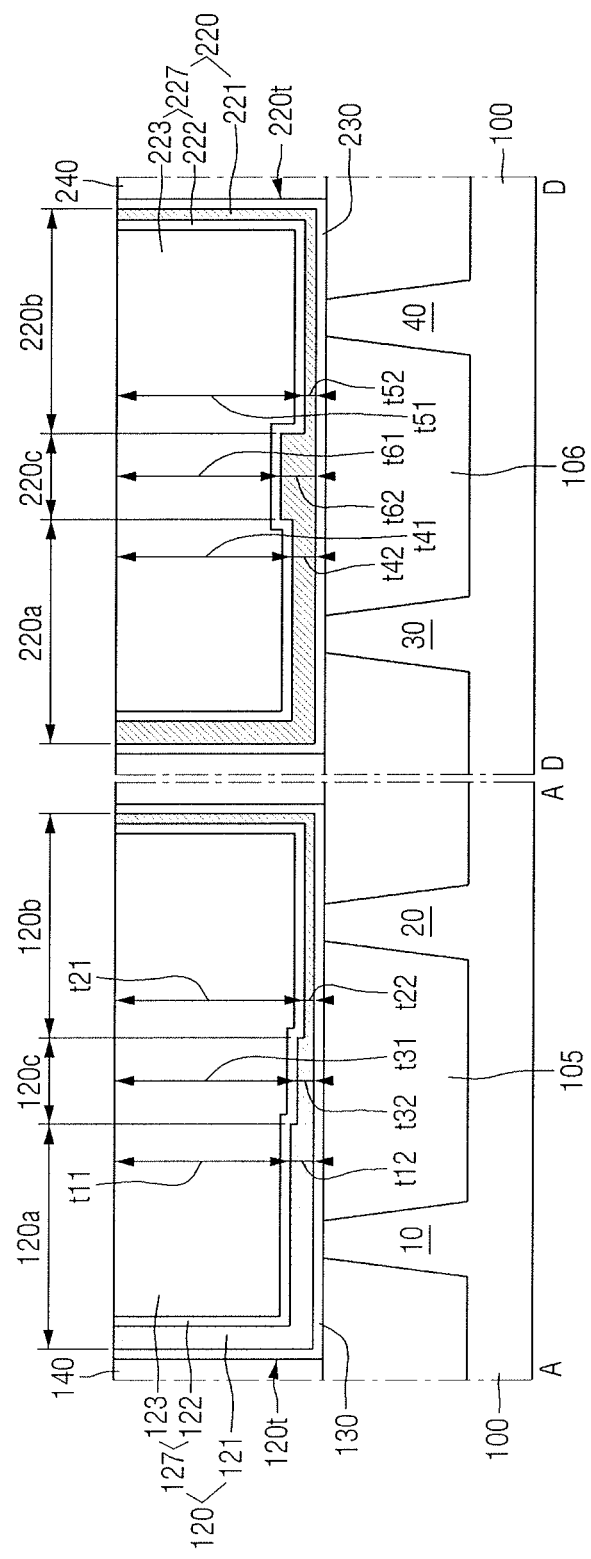

FIGS. 19 and 20 are views illustrating a semiconductor device according to some embodiments of the present disclosure. For simplicity of description, differences relative to FIGS. 16 and 17 will be mainly described. For reference, FIG. 20 is a cross-sectional view taken along lines A-A and D-D of FIG. 19.

Referring to FIGS. 19 and 20, in the semiconductor device according to some embodiments of the present disclosure, the second gate electrode structure 220 may further include a third portion 220c between the first portion 220a of the second gate electrode structure and the second portion 220b of the second gate electrode structure. The third portion 220c of the second gate electrode structure is in contact with the first portion 220a of the second gate electrode structure and the second portion 220b of the second gate electrode structure on the second field insulating layer 106.

A thickness t62 of the second work function adjusting layer 221 in the third portion 220c of the second gate electrode structure may be greater than the thickness t42 of the second work function adjusting layer 221 in the first portion 220a of the second gate electrode structure. Further, the thickness t62 of the second work function adjusting layer 221 in the third portion 220c of the second gate electrode structure may be greater than the thickness t52 of the second work function adjusting layer 221 in the second portion 220b of the second gate electrode structure. A thickness t61 of the second upper gate electrode 227 in the third portion 220c of the second gate electrode structure may be smaller than the thickness t41 of the second upper gate electrode 227 in the first portion 220a of the second gate electrode structure. Further, the thickness t61 of the second upper gate electrode 227 in the third portion 220c of the second gate electrode structure may be smaller than the thickness t51 of the second upper gate electrode 227 in the second portion 220b of the second gate electrode structure.

FIGS. 21 to 28 show intermediate stages of a method for fabricating a semiconductor device according to some embodiments of the present disclosure. FIGS. 21 to 28 are cross-sectional views taken along line A-A of FIG. 1.

Figure 21:
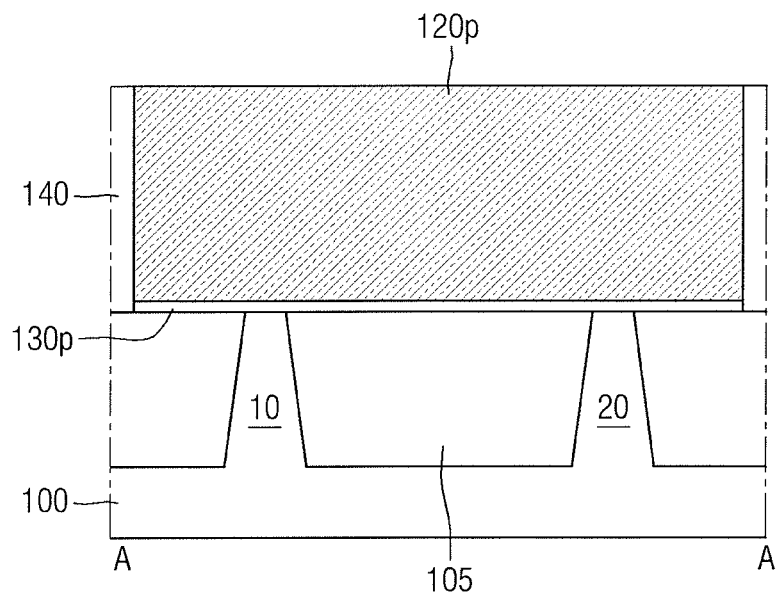
FIGS. 21 to 28 illustrate intermediate stages in a method for fabricating a semiconductor device according to some embodiments of the present disclosure.

Referring to FIG. 21, the substrate 100 including the first active region 10, the second active region 20, and the first field insulating layer 105 is provided. A dummy gate insulating layer 130p and a dummy gate electrode 120p are formed on the substrate 100 across the first active region 10, the first field insulating layer 105, and the second active region 20. The upper surface of the dummy gate electrode 120p may be exposed. A first short side spacer 140 may be formed on the sidewall of the dummy gate electrode 120p.

Figure 22:
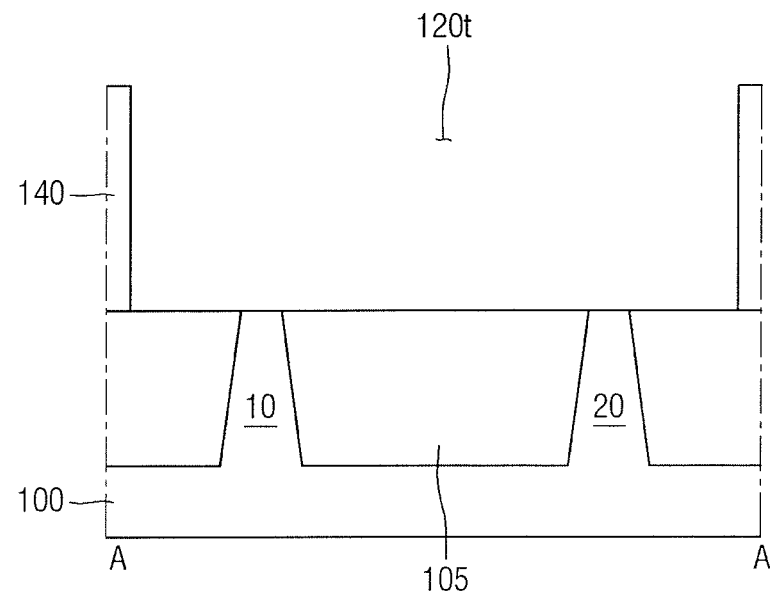

Referring to FIG. 22, the dummy gate electrode 120p and the dummy gate insulating layer 130p may be removed. Accordingly, a first trench 120t may be formed across the first active region 10, the first field insulating layer 105, and the second active region 20.

Figure 23:
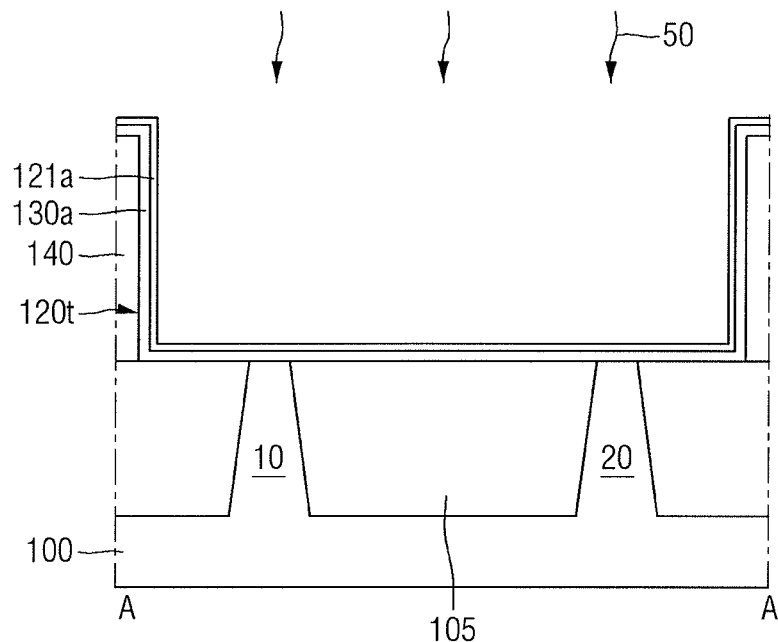

Referring to FIG. 23, a pre-gate insulating layer 130a a may be formed on the substrate 100. The pre-gate insulating layer 130a may extend along the sidewall and the bottom surface of the first trench 120t and the upper surface of the first short side spacer 140.

A first conductive layer 121a may be formed on the pre-gate insulating layer 130a. The first conductive layer 121a may extend along the sidewall and the bottom surface of the first trench 120t. The first conductive layer 121a may include, e.g., titanium nitride (TiN).

For example, after the first conductive layer 121a is formed, a heat treatment process 50 may be performed on the pre-gate insulating layer 130a and the first conductive layer 121a. As another example, unlike the illustration, the heat treatment process 50 may not be performed. As still another example, unlike the illustration, the heat treatment process 50 may be performed before the first conductive layer 121a is formed.

Figure 24:
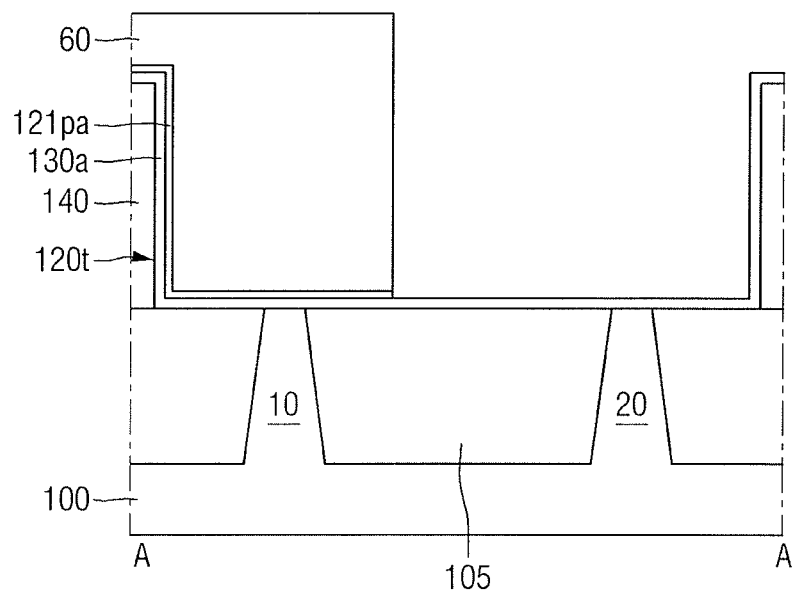

Referring to FIG. 24, a first mask pattern 60 covering a portion of the first conductive layer 121a formed on the bottom surface of the first trench 120t may be formed in the first trench 120t. The first mask pattern 60 may cover the first conductive layer 121a formed on the first active region 10 and a portion of the first field insulating layer 105. The first mask pattern 60 does not cover the first conductive layer 121a formed on the second active region 20.

A patterned first conductive layer 121*pa* may be formed by removing at least a portion of the first conductive layer 121*a* using the first mask pattern 60 as a mask, e.g., a portion of the first conductive layer 121*a* not covered by the first mask pattern 60 may be removed. After the patterned first conductive layer 121*pa* is formed, the first mask pattern 60 is removed.

Figure 25:
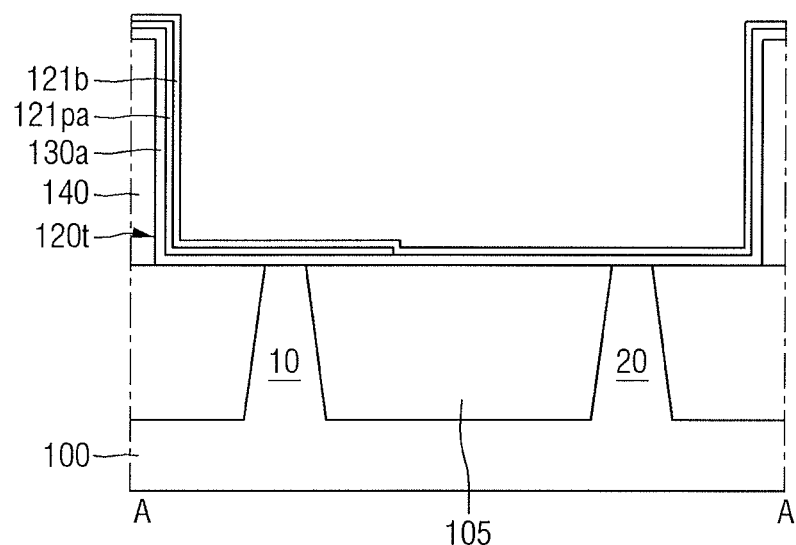

Referring to FIG. 25, on the patterned first conductive layer 121*pa*, a second conductive layer 121*b* extending along the sidewall and the bottom surface of the first trench 120*t* is formed. The second conductive layer 121*b* may include, e.g., titanium nitride (TiN).

Figure 26:
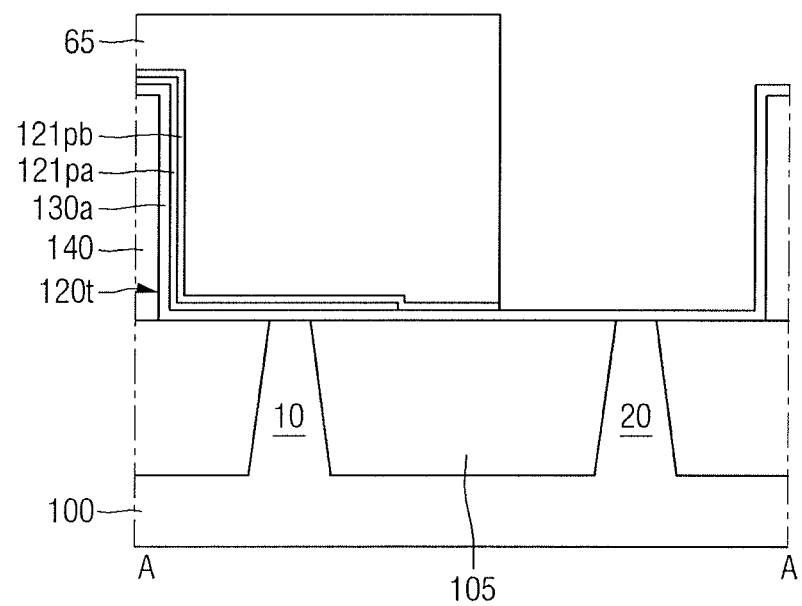

Referring to FIG. 26, a second mask pattern 65 covering a portion of the second conductive layer 121*b* on the bottom surface of the first trench 120*t* may be formed in the first trench 120*t*. The second mask pattern 65 may overlap the entirety of the patterned first conductive layer 121*pa* formed on the bottom surface of the first trench 120*t*. Further, the second mask pattern 65 may overlap a portion of the second conductive layer 121*b* which does not overlap the patterned first conductive layer 121*pa* on the bottom surface of the first trench 120*t*. A patterned second conductive layer 121*pb* may be formed by removing the second conductive layer 121*b* using the second mask pattern 65 as a mask, e.g., a portion of the second conductive layer 121*b* not covered by the second mask pattern 65 may be removed. After the patterned second conductive layer 121*pb* is formed, the second mask pattern 65 is removed.

Figure 27:
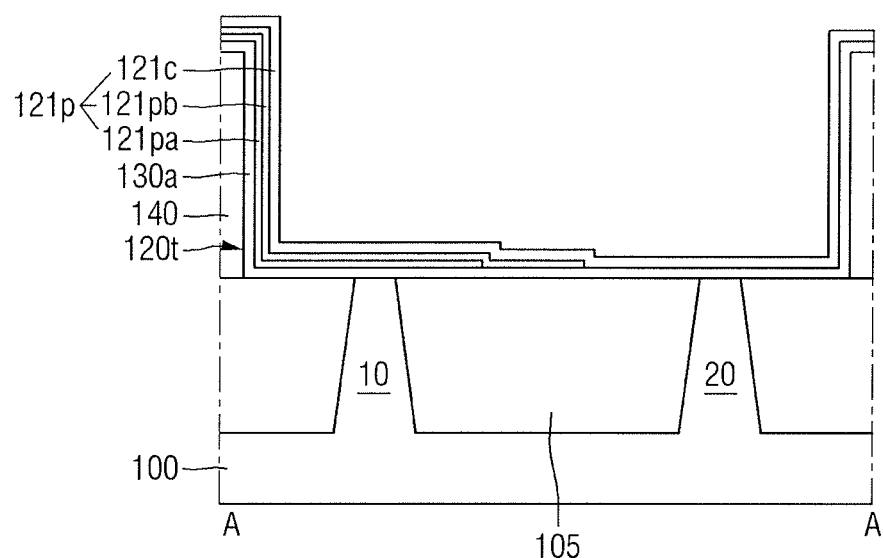

Referring to FIG. 27, a third conductive layer 121*c* may be formed on the patterned first conductive layer 121*pa* and the patterned second conductive layer 121*pb* remaining in the first trench 120*t*. The third conductive layer 121*c* may extend along the sidewall and the bottom surface of the first trench 120*t*. The third conductive layer 121*c* may include, e.g., titanium nitride (TiN).

Accordingly, a pre-work function adjusting layer 121*p* extending along the sidewall and the bottom surface of the first trench 120*t* may be formed. The pre-work function adjusting layer 121*p* may include the patterned first conductive layer 121*pa*, the patterned second conductive layer 121*pb*, and the third conductive layer 121*c*.

Figure 28:
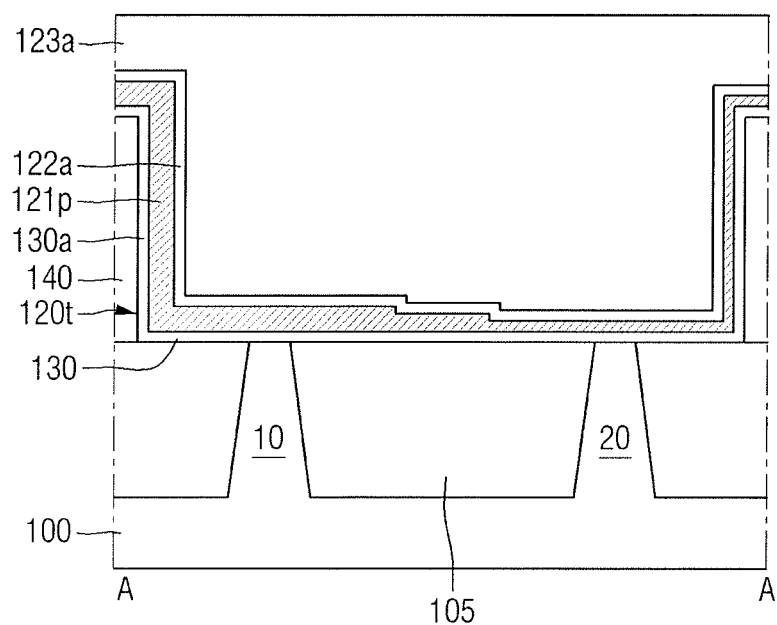

Referring to FIG. 28, a pre-insertion layer 122*a* may be formed on the pre-work function adjusting layer 121*p*. The pre-insertion layer 122*a* may extend along the sidewall and the bottom surface of the first trench 120*t*. On the pre-insertion layer 122*a*, a pre-filling layer 123*a* filling the first trench 120*t* may be formed.

Referring to FIGS. 2A and 3A, by removing the pre-filling layer 123*a*, the pre-insertion layer 122*a*, the pre-work function adjusting layer 121*p* and the pre-gate insulating layer 130*a* formed on the upper surface of the first short side spacer 140 and the interlayer insulating layer 190, the first gate insulating layer 130 and the first gate electrode structure 120 may be formed.

By way of summation and review, aspects of the present disclosure provide a semiconductor device capable of improving a threshold voltage of a transistor through a plurality of metal patterning processes. That is, according to embodiments, the gate electrode of the semiconductor device is formed to have a step-shaped bottom, as the work function adjusting layer under the bottom of the gate electrode is patterned at least twice in a same area to have at least one step difference (e.g., due to overlay difference), thereby minimizing incidence of un-stripping, e.g., during removal of thick layers via a single patterning.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a substrate including a first active region, a second active region, and a field insulating layer between the first active region and the second active region, the field insulating layer being in contact with the first active region and the second active region; and
   a gate electrode structure on the substrate, the gate electrode structure traversing the first active region, the second active region, and the field insulating layer,
   wherein the gate electrode structure includes a first portion over the first active region and the field insulating layer, a second portion over the second active region and the field insulating layer, and a third portion in contact with the first portion and the second portion on the field insulating layer,
   wherein the gate electrode structure includes:
      an upper gate electrode, the upper gate electrode including an insertion layer and a filling layer on the insertion layer, the insertion layer and the filling layer traversing the first active region, the field insulating layer, and the second active region, and
      a work function adjusting layer extending continuously over the first active region, the second active region, and the field insulating layer, the work function adjusting layer including a same material composition and a same conductivity type of material over the first active region, the second active region, and the field insulating layer, and the insertion layer being between the filling layer and the work function adjusting layer,
   wherein a thickness of the upper gate electrode in the third portion of the gate electrode structure is greater than a thickness of the upper gate electrode in the first portion of the gate electrode structure, and
   wherein a thickness of the upper gate electrode in the third portion of the gate electrode structure is smaller than a thickness of the upper gate electrode in the second portion of the gate electrode structure.

2. The semiconductor device as claimed in claim 1, further comprising a gate insulating layer between the substrate and the gate electrode structure, the gate insulating layer traversing the first active region, the second active region, and the field insulating layer,
   wherein the work function adjusting layer extends along a profile of the gate insulating layer directly between the gate insulating layer and the upper gate electrode, and
   wherein the work function adjusting layer is in contact with the gate insulating layer.

3. The semiconductor device as claimed in claim 2, wherein a thickness of the work function adjusting layer in the third portion of the gate electrode structure is smaller than a thickness of the work function adjusting layer in the first portion of the gate electrode structure, and wherein a thickness of the work function adjusting layer in the third portion of the gate electrode structure is greater than a thickness of the work function adjusting layer in the second portion of the gate electrode structure.

4. The semiconductor device as claimed in claim 2, wherein the work function adjusting layer includes a lower work function adjusting layer and an upper work function adjusting layer on the lower work function adjusting layer,
wherein the upper work function adjusting layer is in contact with the lower work function adjusting layer, and
wherein the upper work function adjusting layer and the lower work function adjusting layer include the same material.

5. The semiconductor device as claimed in claim 1, wherein the gate electrode structure includes a lower conductive layer and an etch stop layer sequentially formed on the substrate.

6. The semiconductor device as claimed in claim 5, wherein each of the lower conductive layer and the work function adjusting layer includes TiN, and the etch stop layer includes TaN.

7. The semiconductor device as claimed in claim 1, wherein the first active region includes a channel region of a p-type transistor and the second active region includes a channel region of an n-type transistor.

8. The semiconductor device as claimed in claim 1, wherein the first active region and the second active region are a first fin-shaped pattern and a second fin-shaped pattern, respectively.

9. A semiconductor device, comprising:
a first fin-shaped pattern and a second fin-shaped pattern adjacent to each other on a substrate;
a field insulating layer between the first fin-shaped pattern and the second fin-shaped pattern, the field insulating layer covering a portion of the first fin-shaped pattern and a portion of the second fin-shaped pattern;
an interlayer insulating layer on the substrate, the interlayer insulating layer including a trench traversing the first fin-shaped pattern, the field insulating layer, and the second fin-shaped pattern;
a gate insulating layer extending along a sidewall and a bottom surface of the trench; and
a gate electrode structure on the gate insulating layer, the gate electrode structure traversing the first fin-shaped pattern, the field insulating layer, and the second fin-shaped pattern,
wherein the gate electrode structure includes a first portion over the first fin-shaped pattern and the field insulating layer, a second portion over the second fin-shaped pattern and the field insulating layer, and a third portion in contact with the first portion and the second portion on the field insulating layer,
wherein the gate electrode structure includes a work function adjusting layer over the first fin-shaped pattern and the field insulating layer, and an upper gate electrode on the work function adjusting layer,
wherein the upper gate electrode includes an insertion layer on the work function adjusting layer and traversing the first fin-shaped pattern, the field insulating layer and the second fin-shaped pattern, and a filling layer on the insertion layer,
wherein a thickness of the upper gate electrode in the third portion of the gate electrode structure is greater than a thickness of the upper gate electrode in the first portion of the gate electrode structure,
wherein a thickness of the upper gate electrode in the third portion of the gate electrode structure is smaller than a thickness of the upper gate electrode in the second portion of the gate electrode structure,
wherein the work function adjusting layer is across the first fin-shaped pattern, the field insulating layer, and the second fin-shaped pattern,
wherein a thickness of the work function adjusting layer in the third portion of the gate electrode structure is smaller than a thickness of the work function adjusting layer in the first portion of the gate electrode structure, and
wherein a thickness of the work function adjusting layer in the third portion of the gate electrode structure is greater than a thickness of the work function adjusting layer in the second portion of the gate electrode structure.

10. The semiconductor device as claimed in claim 9, wherein the work function adjusting layer is in contact with the gate insulating layer.

11. The semiconductor device as claimed in claim 9, wherein the second portion of the gate electrode structure does not include the work function adjusting layer.

12. The semiconductor device as claimed in claim 11, wherein the gate electrode structure includes a lower conductive layer and an etch stop layer sequentially formed on the gate insulating layer, and
wherein in the second portion of the gate electrode structure, the upper gate electrode is in contact with the etch stop layer.

13. The semiconductor device as claimed in claim 9, further comprising a fin-shaped protrusion between the first fin-shaped pattern and the second fin-shaped pattern,
wherein the field insulating layer covers an upper surface of the fin-shaped protrusion.

14. The semiconductor device as claimed in claim 9, wherein the work function adjusting layer includes a lower work function adjusting layer and an upper work function adjusting layer on the lower work function adjusting layer,
wherein the upper work function adjusting layer is in contact with the lower work function adjusting layer, and
wherein the upper work function adjusting layer and the lower work function adjusting layer include the same material.

15. A semiconductor device, comprising:
a substrate including a first active region, a second active region, a first field insulating layer in contact with the first active region and the second active region between the first active region and the second active region, a third active region, a fourth active region and a second field insulating layer in contact with the third active region and the fourth active region between the third active region and the fourth active region;
a first gate electrode structure on the substrate, the first gate electrode structure traversing the first active region, the second active region and the first field insulating layer; and
a second gate electrode structure on the substrate, the second gate electrode structure traversing the third active region, the fourth active region and the second field insulating layer,
wherein the first gate electrode structure includes a first portion over the first active region and the first field insulating layer, a second portion over the second active region and the first field insulating layer, and a third portion in contact with the first portion and the second portion on the first field insulating layer, wherein the second gate electrode structure includes a fourth portion over the third active region and the second field insulating layer, and a fifth portion over the fourth active region, and the second field insulating layer, wherein the first gate electrode structure includes:
- a first insertion layer traversing the first active region, the first field insulating layer and the second active region,
- a work function adjusting layer extending continuously over the first active region, the second active region, and the first field insulating layer, the work function adjusting layer including a same material composition over the first active region, the second active region, and the first field insulating layer, and
- a first upper gate electrode including a first filling layer on the first insertion layer, the first insertion layer being between the first filling layer and the work function adjusting layer, wherein the second gate electrode structure includes a second insertion layer traversing the third active region, the second field insulating layer and the fourth active region, and a second upper gate electrode including a second filling layer on the second insertion layer, wherein a thickness of the first upper gate electrode in the third portion of the first gate electrode structure is greater than a thickness of the first upper gate electrode in the first portion of the first gate electrode structure, wherein a thickness of the first upper gate electrode in the third portion of the first gate electrode structure is smaller than a thickness of the first upper gate electrode in the second portion of the first gate electrode structure, and wherein a thickness of the second upper gate electrode in the fifth portion of the second gate electrode structure is different from a thickness of the second upper gate electrode in the fourth portion of the second gate electrode structure.

16. The semiconductor device as claimed in claim 1, wherein the first and second active regions include a first fin-shaped pattern and a second fin-shaped pattern, respectively, the work function adjusting layer extending continuously over the first and second fin-shaped patterns.

17. The semiconductor device as claimed in claim 2, wherein the insertion layer is directly between the filling layer and the work function adjusting layer.

* * * * *